US010577691B2

(12) United States Patent
Nowak et al.

(10) Patent No.: US 10,577,691 B2
(45) Date of Patent: Mar. 3, 2020

(54) SINGLE ALD CYCLE THICKNESS CONTROL IN MULTI-STATION SUBSTRATE DEPOSITION SYSTEMS

(71) Applicant: Lam Research Corporation, Fremont, CA (US)

(72) Inventors: Romuald Nowak, Cupertino, CA (US); Hu Kang, Tualatin, OR (US); Adrien LaVoie, Newberg, OR (US); Jun Qian, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 15/703,694

(22) Filed: Sep. 13, 2017

(65) Prior Publication Data

US 2018/0010250 A1  Jan. 11, 2018

Related U.S. Application Data

(62) Division of application No. 14/455,796, filed on Aug. 8, 2014, now Pat. No. 9,797,042.

(Continued)

(51) Int. Cl.
  *C23C 16/455*   (2006.01)
  *C23C 16/54*    (2006.01)
  (Continued)

(52) U.S. Cl.
  CPC ........ *C23C 16/54* (2013.01); *C23C 16/45525* (2013.01); *C23C 16/45542* (2013.01);
  (Continued)

(58) Field of Classification Search
  CPC ............................................. C23C 16/45525
  (Continued)

(56) References Cited

U.S. PATENT DOCUMENTS 6,860,965 B1   3/2005  Stevens
8,119,527 B1   2/2012  Chadrashekar et al.
  (Continued)

FOREIGN PATENT DOCUMENTS

CN      1853003 A   10/2006
CN    101330015 A   12/2008
  (Continued)

OTHER PUBLICATIONS

U.S. Office Action, dated Aug. 26, 2016, issued in U.S. Appl. No. 14/455,796.

(Continued)

*Primary Examiner* — Elizabeth A Burkhart
(74) *Attorney, Agent, or Firm* — Weaver Austin Villeneuve & Sampson LLP

(57) ABSTRACT

Disclosed are methods of depositing films of material on multiple semiconductor substrates in a multi-station processing chamber. The methods may include loading a first set of one or more substrates into the processing chamber at a first set of one or more process stations and depositing film material onto the first set of substrates by performing N cycles of film deposition. Thereafter, the methods may further include transferring the first set of substrates from the first set of process stations to a second set of one or more process stations, loading a second set of one or more substrates at the first set of process stations, and depositing film material onto the first and second sets of substrates by performing N' cycles of film deposition, wherein N' is not equal to N. Also disclosed are apparatuses and computer-readable media which may be used to perform similar operations.

17 Claims, 11 Drawing Sheets

Related U.S. Application Data

(60) Provisional application No. 61/994,025, filed on May 15, 2014.

(51) Int. Cl.
  *H01L 21/02* (2006.01)
  *H01L 21/67* (2006.01)
  *C23C 16/52* (2006.01)

(52) U.S. Cl.
  CPC .......... *C23C 16/52* (2013.01); *H01L 21/0228* (2013.01); *H01L 21/02164* (2013.01); *H01L 21/67161* (2013.01); *H01L 21/67207* (2013.01)

(58) Field of Classification Search
  USPC ......................................................... 118/730
  See application file for complete search history.

(56) References Cited

U.S. PATENT DOCUMENTS

| | | | |
|---|---|---|---|
| 8,637,411 | B2 | 1/2014 | Swaminathan et al. |
| 8,728,956 | B2 | 5/2014 | LaVoie et al. |
| 8,956,983 | B2 | 2/2015 | Swaminathan et al. |
| 9,076,646 | B2 | 7/2015 | Sims et al. |
| 9,263,350 | B2 | 2/2016 | Kapoor et al. |
| 9,355,886 | B2 | 5/2016 | Swaminathan et al. |
| 9,502,238 | B2 | 11/2016 | Danek et al. |
| 9,677,176 | B2 | 6/2017 | Chandrasekharan et al. |
| 9,797,042 | B2 | 10/2017 | Nowak et al. |
| 2005/0031786 | A1* | 2/2005 | Lee .................... H01L 21/28556 427/255.28 |
| 2006/0166501 | A1 | 7/2006 | Kaushal et al. |
| 2008/0131601 | A1 | 6/2008 | Kim et al. |
| 2009/0325366 | A1 | 12/2009 | Moriya et al. |
| 2012/0009802 | A1* | 1/2012 | LaVoie .................. C23C 16/045 438/783 |
| 2013/0196078 | A1 | 8/2013 | Yudovsky et al. |
| 2014/0030444 | A1 | 1/2014 | Swaminathan et al. |
| 2015/0017812 | A1 | 1/2015 | Chandrasekharan et al. |
| 2015/0332912 | A1 | 11/2015 | Nowak et al. |
| 2016/0340782 | A1 | 11/2016 | Chandrasekharan et al. |
| 2016/0348242 | A1 | 12/2016 | Sung et al. |
| 2017/0029947 | A1 | 2/2017 | Kawahara et al. |
| 2017/0029948 | A1 | 2/2017 | Jongbloed et al. |
| 2017/0314129 | A1 | 11/2017 | Karim et al. |
| 2019/0085448 | A1 | 3/2019 | Phillips et al. |

FOREIGN PATENT DOCUMENTS

| | | |
|---|---|---|
| JP | 2004-068091 A | 3/2004 |
| JP | 2008-513980 A | 5/2008 |
| KR | 10-2007-0000279 A | 1/2007 |
| KR | 10-0715862 B1 | 5/2007 |
| KR | 10-2013-0127588 A | 11/2013 |
| WO | WO2011/125471 A1 | 10/2011 |

OTHER PUBLICATIONS

U.S. Final Office Action, dated Mar. 7, 2017, issued in U.S. Appl. No. 14/455,796.
U.S. Notice of Allowance, dated Jun. 15, 2017, issued in U.S. Appl. No. 14/455,796.
Chinese First Office Action dated May 24, 2017, issued in Application No. CN 201510245528.X.
U.S. Appl. No. 15/143,338, filed Apr. 29, 2016, Karim et al.
U.S. Office Action, dated Feb. 7, 2019, issued in U.S. Appl. No. 15/143,338.
U.S. Final Office Action, dated Aug. 15, 2019, issued in U.S. Appl. No. 15/143,338.
U.S. Office Action, dated Aug. 6, 2019, issued in U.S. Appl. No. 15/785,093.
Chinese Second Office Action dated Feb. 23, 2018, issued in Application No. CN 201510245528.X.
Chinese Third Office Action dated Sep. 25, 2018, issued in Application No. CN 201510245528.X.
Japanese Office Action [Reason for Refusal] dated Mar. 27, 2019, issued in Application No. JP 2015-095293.
Japanese Decision to Grant dated Jul. 16, 2019, issued in Application No. JP 2015-095293.
Taiwanese First Office Action dated Oct. 1, 2018, issued in Application No. TW 104115353.
Chinese First Office Action dated Feb. 12, 2019, issued in Application No. CN 201710291562.X.
International Search Report and Written Opinion dated Feb. 1, 2019, issued in Application No. PCT/US18/49864.
U.S. Final Office Action, dated Oct. 31, 2019, issued in U.S. Appl. No. 15/785,093.

\* cited by examiner

SINGLE ALD CYCLE THICKNESS CONTROL IN MULTI-STATION SUBSTRATE DEPOSITION SYSTEMS

CROSS-REFERENCE TO RELATED APPLICATION

This application is a divisional of and claims priority to U.S. application Ser. No. 14/455,796, filed on Aug. 8, 2014, and titled "SINGLE ALD CYCLE THICKNESS CONTROL IN MULTI-STATION SUBSTRATE DEPOSITION SYSTEMS," which claims priority benefit under 35 U.S.C. § 119(e) to U.S. Provisional Application. No. 61/994,025, filed on May 15, 2014, and titled "SINGLE ALD CYCLE THICKNESS CONTROL IN MULTI-STATION PARALLEL SUBSTRATE DEPOSITION SYSTEMS," which are hereby incorporated by reference in their entirety for all purposes.

BACKGROUND

As device and features size continue to shrink in the semiconductor industry, and also as 3D devices structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure.

The challenge with ALD, however, has to do with wafer processing throughput. Because each cycle of ALD only deposits one thin adsorption-limited layer, many cycles of ALD need to be performed in sequence to deposit a film of any desired appreciable thickness, and each cycle takes time. Accordingly, improved methods and apparatuses are sought to process wafers in parallel and thereby to improve wafer/substrate processing throughput in semiconductor fabrication operations.

SUMMARY

Disclosed herein are methods of depositing films of material on multiple semiconductor substrates in a multi-station processing chamber. In some embodiments, the methods may include loading a first set of one or more substrates into the processing chamber at a first set of one or more process stations and depositing film material onto the first set of substrates at the first set of process stations by performing N cycles of film deposition. Thereafter, certain such embodiment methods may include transferring the first set of substrates from the first set of process stations to a second set of one or more process stations in the processing chamber, loading a second set of one or more substrates into the processing chamber at the first set of process stations, and depositing film material onto the second set of substrates at the first set of process stations and onto the first set of substrates at the second set of process stations by performing N' cycles of film deposition, wherein N' is not equal to N. Furthermore, in certain embodiments, after the depositing of film material onto the first and second sets of substrates, the methods may further include unloading the first set of substrates from the processing chamber, transferring the second set of substrates from the first to the second set of process stations, optionally loading a third set of one or more substrates into the processing chamber at the first set of one or more process stations and depositing film material onto the second set of substrates at the second set of process stations, and optionally onto the third set of substrates at the first set of process stations by performing N cycles of film deposition. In certain such embodiments, N and N' may differ by 1. This sequence of operations may be repeated in this manner, alternating between N and N' cycles of deposition at each deposition step, and continued throughout the entire batch of substrates being processed until the last two substrates in the batch are subjected to the last N or N' cycles of film deposition and unloaded from the processing chamber.

In certain such embodiments, a single cycle (of the N and/or N' cycles) of film deposition may include adsorbing a film precursor onto the substrate such that the precursor forms an adsorption-limited layer on the substrate, removing at least some unadsorbed film precursor from the volume surrounding the adsorbed precursor, reacting adsorbed film precursor, after removing unadsorbed precursor, to form a film layer on the substrate, and removing desorbed film precursor and/or reaction by-product from the volume surrounding the film layer when present after reacting the adsorbed precursor. In some embodiments, the deposited film material may include a dielectric material or a conducting material, and in certain such embodiments, the dielectric may include one or more silicon oxides, silicon carbides, or silicon nitrides. Although, the techniques and apparatuses disclosed herein are effective for the deposition of silicon oxide films via ALD processes, they more generally may be applied to any type of film material used in semiconductor manufacturing deposited by any method employing multiple deposition cycles, and the deposition methods and processing chambers described herein are effective for this purpose.

In some embodiments, film deposition methods may include choosing a target thickness D of the deposited film, determining that the closest positive integer M to D/d is odd (where d is the anticipated mean thickness of a layer of film deposited by a single cycle of film deposition), and choosing N and N' such that N+N'=M and |N−N'|=1. In some embodiments, the film deposition methods may include choosing a target thickness D of the deposited film, choosing N to be the closest positive integer to ½*D/d (where d is the anticipated mean thickness of a layer of film deposited by a single cycle of film deposition), and choosing N' to be either N−1 or N+1.

Also disclosed herein are methods of depositing films of material on multiple semiconductor substrates in a multi-station processing chamber. In some embodiments, the method may include (a) loading X substrates into the processing chamber at X process stations, (b) depositing, after (a), film material onto the X substrates by performing N cycles of film deposition, (c) rotating each substrate to a process stations different from the process stations that each substrate was loaded into in (a), and (d) after the rotating in (c), depositing film material onto the X substrates by performing N' cycles of film deposition, wherein each process station that performs at least 1 cycle of film deposition deposits at least N−1 cycles of film deposition on each substrate. In some embodiments, X may be an integer of 2 or greater, at least a first substrate is loaded into the processing chamber at a first process station, and at least a second substrate is loaded into the processing chamber at a second process station.

Also disclosed herein are methods of depositing films of material on multiple semiconductor substrates in a multi-station processing chamber. In some embodiments, the methods may include (a) receiving at least a first substrate in a first process station of the reaction chamber, (b) depositing a portion of the film thickness on at least the first substrate by performing N cycles of a cyclic deposition process, (c) transferring at least the first substrate to a second process station, (d) depositing, after (c), another portion of the film thickness on at least the first substrate by performing N' cycles of the cyclic deposition process, wherein N does not equal N' and N and N' are chosen to achieve the defined thickness, and (e) removing at least the first substrate from the reaction chamber.

In certain such embodiments, N' may be equal to N, N−1, or N+1. Furthermore, in certain such embodiments, X substrates may be received in a plurality of process stations in the reaction chamber. In certain further such embodiments, X may equal 2 and the methods may further include choosing a defined thickness of D, determining that the closest positive integer M to D/d is not a multiple of X, where d is the anticipated mean thickness of a layer of film deposited by a single cycle of film deposition, and choosing N and N' such that N+N'=M and |N−N'|=1. In additional further such embodiments, X may equal 4 and the methods may further include choosing a defined thickness of D, choosing N to be the closest positive integer to ¼*D/d, where d is the anticipated mean thickness of a layer of film deposited by a single cycle of film deposition, and choosing N' to be either N−1, N, or N+1.

In certain additional such embodiments, the methods may further include, after (d) and before (e), (f) transferring at least the first substrate to a third process station in the reaction chamber, and (g) depositing yet another portion of the film thickness on at least the first substrate by performing N'' cycles of the cyclic deposition process, wherein N'' is equal to or not equal to N, and N, N', and N'' are chosen to achieve the defined thickness.

In certain additional such embodiments, the methods may further include, after (g) and before (e), (h) transferring at least the first substrate to a fourth process station in the reaction chamber, and (i) depositing an additional portion of the film thickness on at least the first substrate by performing N''' cycles of the cyclic deposition process, wherein N''' is equal to or not equal to N, and N, N', N'', and N''' are chosen to achieve the defined thickness. In certain further such embodiments, 4 substrates may be received in 4 process stations in the reaction chamber and the methods may further include choosing a defined thickness of D, determining that the closest positive integer M to D/d is not a multiple of 4, where d is the anticipated mean thickness of a layer of film deposited by a single cycle of film deposition, and choosing N and N' such that N+N'=M and |N−N'|=1.

In certain additional such embodiments, a plurality of substrates may be received in a plurality of process stations in the reaction chamber in (a), a portion of the film thickness may be deposited on the plurality of substrates by performing N cycles of the cyclic deposition process in (b), the plurality of substrates may be transferred to different process stations in the reaction chamber in (c), and another portion of the film thickness may be deposited on the plurality of substrates by performing N' cycles of the cyclic deposition process in (d). In certain further such embodiments, the plurality of substrates may include at least the first substrate and a second substrate and (c) may further include transferring the second substrate from the second process station to the first process station.

In certain additional such embodiments, the methods may further include, after (c) and before (d), receiving at least one additional substrate in a process station in the reaction chamber, wherein (d) further comprises depositing another portion of the film thickness on the at least one addition substrate. In certain further such embodiments, the at least one additional substrate may be received in the first process station in the reaction chamber.

Also disclosed herein are multi-station substrate processing apparatuses for depositing films of material on multiple semiconductor substrates. In some embodiments, the apparatuses may include a processing chamber, a first set of one or more process stations contained in the processing chamber, each having a substrate holder, a second set of one or more process stations contained in the processing chamber, each having a substrate holder, one or more valves for controlling flow of film precursor to the process stations, a valve-operated vacuum source and/or a gas purge source for removing film precursor from the volumes surrounding the process stations contained in the processing chamber, a substrate loading device for loading substrates into the processing chamber at one or more of the process stations, a substrate transferring device for transferring one or more substrates from the first set of process stations to the second set of process stations, and one or more controllers.

In certain such embodiments, the one or more controllers may include machine-readable instructions for operating the substrate loading device, the substrate transferring device, the one or more valves, and the vacuum source to deposit films of material onto the substrates. In certain such embodiments, the machine readable instructions include instructions for loading a first set of one or more substrates into the processing chamber at the first set of process stations, and depositing film material onto the first set of substrates at the first set of process stations by performing N cycles of film deposition. In certain such embodiments, the machine readable instructions may further include instructions for thereafter transferring the first set of substrates from the first set of process stations to the second set of process stations, loading a second set of one or more substrates into the processing chamber at the first set of process stations, and depositing film material onto the second set of substrates at the first set of process stations and onto the first set of substrates at the second set of process stations by performing N' cycles of film deposition. Furthermore, certain such apparatus embodiments may include additional computer readable instructions for thereafter unloading the first set of substrates from the processing chamber, transferring the second set of substrates from the first to the second set of process stations, loading a third set of one or more substrates into the processing chamber at the first set of process stations and depositing film material onto the second set of substrates at the second set of process stations and optionally onto the third set of substrates at the first set of processing stations by performing N cycles of film deposition.

In some embodiments, a multi-station substrate processing apparatus may include a substrate loading device including a substrate handler robot for placing substrates onto the substrate holder(s) of one or more process stations. In some embodiments, the substrate transferring device may include a carousel which operates by rotating the substrates with respect to a central axis substantially perpendicular to the plane of the substrates and substantially equidistant between the substrates.

In some embodiments, the processing chamber contains 4 process stations, and each of the first and second sets of process stations consist of 2 process stations. In some embodiments, the processing chamber contains 2 process stations, and wherein each of the first and second sets of process stations consist of 1 process station. In some embodiments, the processing chamber contains an even number of process stations S, and wherein each of the first and second sets of process stations consist of S/2 process stations. In some embodiments, the deposited film material may include a dielectric such as silicon oxide, silicon nitride, or silicon carbide. In some embodiments, the deposited film material may include a conductor.

In some embodiments, the one or more controllers of the multi-station substrate processing apparatus further includes machine-readable instructions for choosing a target thickness D of the deposited film, choosing N to be the closest positive integer to ½*D/d (where d is the anticipated mean thickness of a layer of film deposited by a single cycle of film deposition), and choosing N' to be either N−1, N, or N+1. In some embodiments, the one or more controllers further include instructions for choosing N' to be N when |Δ|<d/2, where Δ=2*d*N−D, choosing N' to be N−1 when |Δ|>d/2 and Δ>0, where Δ=2*d*N−D, and choosing N' to be N+1 when |Δ|>d/2 and Δ<0, where Δ=2*d*N−D.

Also disclosed herein are multi-station substrate processing apparatuses for depositing films of material on multiple semiconductor substrates. In some embodiments, the apparatus may include a processing chamber, a first process station contained in the processing chamber, a second process station contained in the processing chamber, one or more valves for controlling flow of film precursor to the process stations, a valve-operated vacuum source for removing film precursor from the volumes surrounding the process stations contained in the processing chamber, a substrate loading device for loading substrates into the processing chamber at one or more of the process stations, a substrate transferring device for transferring one or more substrates from the first process station to the second process station, and one or more controllers including machine-readable instructions for operating the substrate loading device, the substrate transferring device, the one or more valves, and the vacuum source to deposit films of material onto the substrates. The instructions may include: (a) loading at least a first substrate into the processing chamber at the first process station, (b) depositing a portion of a defined film thickness on at least the first substrate at the first process station by performing N cycles of film deposition, (c) transferring at least the first substrate to the second process station, (d) depositing, after (c), another portion of the defined film thickness on at least the first substrate by performing N' cycles of the cyclic deposition process, wherein N does not equal N' and N and N' are chosen to achieve the defined film thickness, and (e) removing at least the first substrate from the reaction chamber.

In some embodiments, the instructions may further include: loading, in (a), a plurality of substrates at a plurality of process stations, depositing, in (b), a portion of the defined film thickness on the plurality of substrates by performing N cycles of the cyclic deposition process, transferring, in (c), the plurality of substrates to different process stations in the processing chamber, and depositing, in (d), another portion of the defined film thickness on the plurality of substrates by performing N' cycles of the cyclic deposition process.

In some embodiments, the one or more controllers may further include machine-readable instructions for loading, after (c) and before (d), at least one additional substrate in a process station in the reaction chamber, such that (d) further includes depositing another portion of the film thickness on the at least one addition substrate.

In some embodiments, a single cycle of film deposition may include: (i) adsorbing a film precursor onto the substrate such that the precursor forms an adsorption-limited layer on the substrate, (ii) removing at least some unadsorbed film precursor from the volume surrounding the adsorbed precursor, (iii) reacting adsorbed film precursor, after removing unadsorbed precursor in (ii), to form a film layer on the substrate, and (iv) removing desorbed film precursor and/or reaction by-product from the volume surrounding the film layer when present after reacting the adsorbed precursor.

In some embodiments, the substrate loading device may include a substrate handler robot for placing substrates onto at least one of the process stations.

In some embodiments, the substrate transferring device may include a carousel which operates by rotating the substrates with respect to a central axis substantially perpendicular to the plane of the substrates and substantially equidistant between the substrates.

In some embodiments, the processing chamber may contain 4 process stations. In certain such embodiments, the one or more controllers may further include machine-readable instructions for choosing a target thickness D of the deposited film, choosing N to be the closest positive integer to ¼*D/d, where d is the anticipated mean thickness of a layer of film deposited by a single cycle of film deposition, and choosing N' to be either N−1, N, or N+1. In certain such embodiments, the one or more controllers may further comprise machine-readable instructions for: choosing N' to be N when |Δ|<d/2, where Δ=4*d*N−D, choosing N' to be N−1 when |Δ|>d/2 and Δ>0, where Δ=4*d*N−D, and choosing N' to be N+1 when |Δ|>d/2 and Δ<0, where Δ=4*d*N−D.

Also disclosed herein are machine-readable media having machine-readable instructions for performing any and all various combination of the operations disclosed herein. Such instructions may be read and/or executed by the one or more system controllers of the multi-station substrate processing apparatuses disclosed herein.

DETAILED DESCRIPTION

In the following description, numerous specific details are set forth in order to provide a thorough understanding of the present invention. However, the present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

Disclosed herein are methods and apparatuses for improving thin film thickness accuracy on semiconductor substrates (measured as a deviation from the thickness target) without a loss of throughput in semiconductor fabrication operations involving multiple film deposition cycles, each producing a "discrete" film thickness. As mentioned above, ALD is one such film deposition method, but any technique which puts down thin layers of film and used in a repeating sequential matter may be viewed as involving multiple cycles of deposition, and the methods and apparatuses disclosed herein may also be used generally for controlling film thickness in such multi-cycle deposition operations.

Overview of Film Deposition Apparatuses

Figure 1:
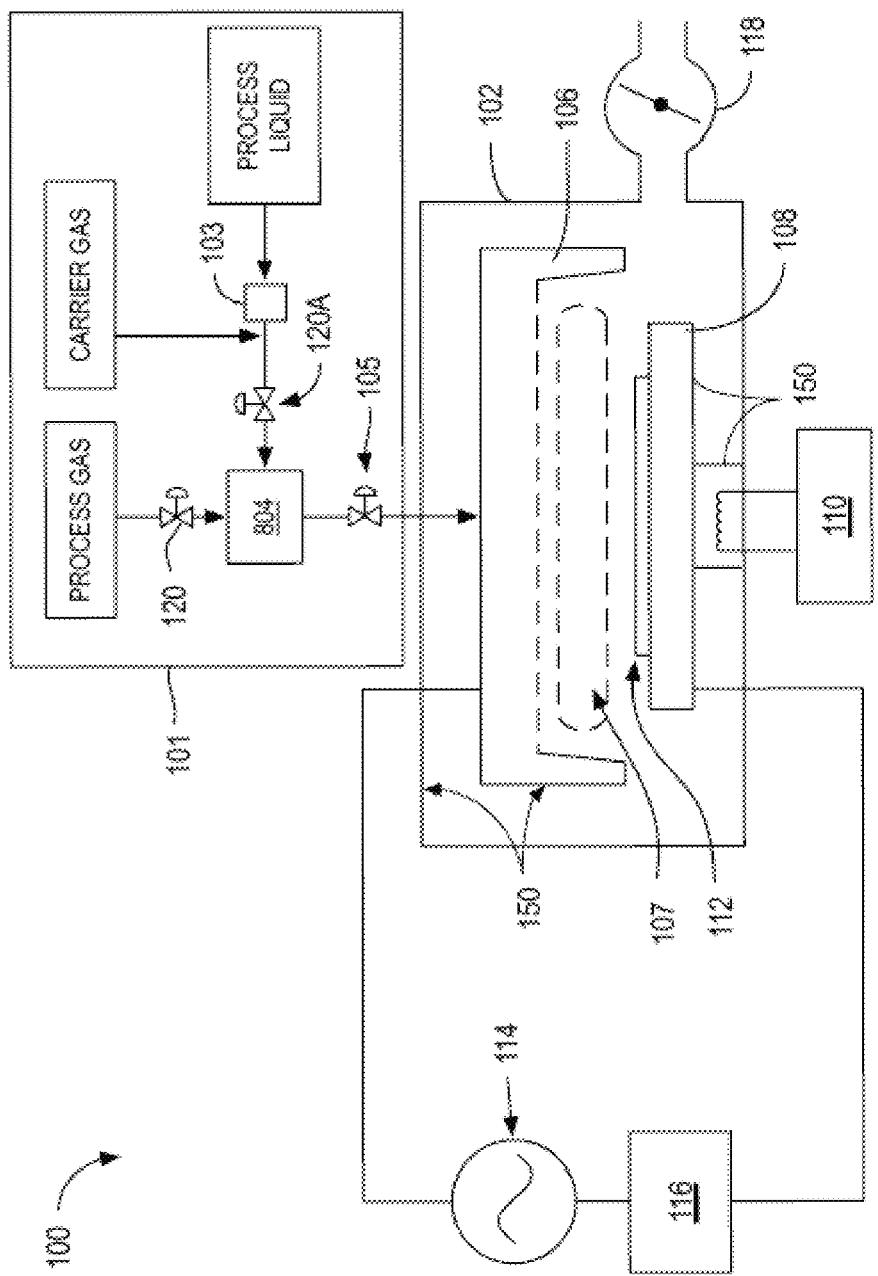
FIG. 1 is a schematic of a substrate processing apparatus having a processing chamber with a single process station.

Operations for depositing films on semiconductor substrates may generally be performed in a substrate processing apparatus like that shown in FIG. 1. The apparatus 100 of FIG. 1, which will be described in greater detail below, has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1 and will be described in further detail below. In any event, the apparatus schematically illustrated in FIG. 1 provides the basic equipment for performing film deposition operations such as ALD on semiconductor substrates.

Overview of Parallel Substrate Processing Apparatuses to Accelerate Film Deposition While in some circumstances an substrate processing apparatus like that of FIG. 1 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 2A. The substrate processing apparatus 200 of FIG. 2A, still employs a single substrate processing chamber 214, however, within the single interior volume defined by the walls of the processing chamber, are multiple substrate process stations, each of which may be used to perform processing operations on a substrate held in a wafer holder at that process station. In this particular embodiment, the multi-station substrate processing apparatus 200 is shown having 4 process stations 201, 202, 203, and 204. Other similar multi-station processing apparatuses may have more or fewer processing stations depending on the embodiment and, for instance, the desired level of parallel wafer processing, size/space constraints, cost constraints, etc. Also shown in FIG. 2A, which will be described in greater detail below, are a substrate handler robot 226 and a controller 250 which also assist the goal of performing efficient multi-substrate parallel deposition operations.

Figure 2A:
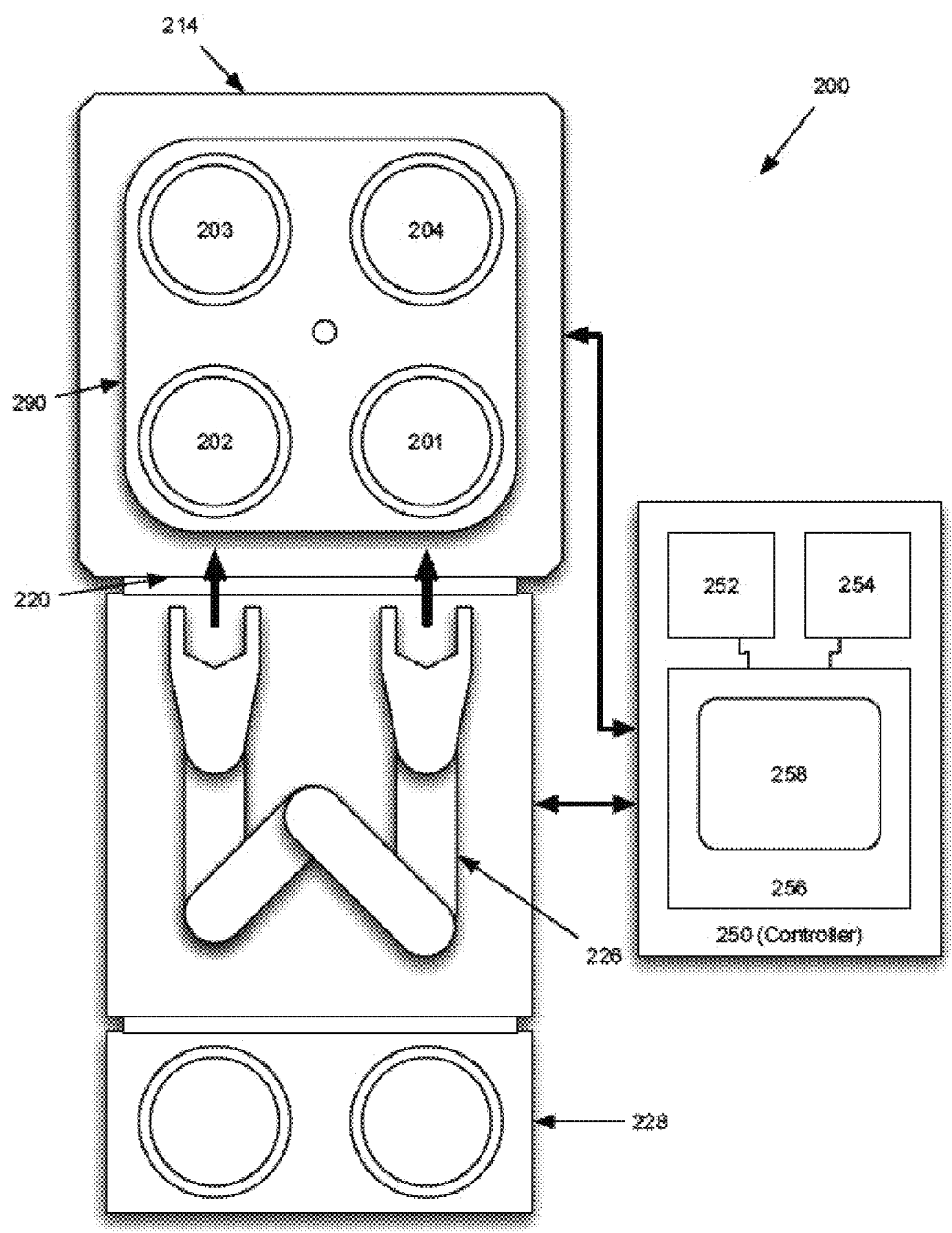
FIG. 2A is a schematic of a four-station substrate processing apparatus having a substrate handler robot for loading and unloading substrates from two process stations and a controller for operating the apparatus.

Various efficiencies may be achieved through the use of a multi-station processing apparatus like that shown in FIG. 2A with respect to both equipment cost and operational expenses. For instance, a single vacuum pump (not shown in FIG. 2A, but e.g. 118 in FIG. 1) may be used to create a single high-vacuum environment for all 4 process stations, and may evacuate spent process gases in all 4 process stations. Depending on the embodiment, each process station may have its own dedicated showerhead for gas delivery (see, e.g., 106 in FIG. 1), but share the same gas delivery system (e.g., 101 in FIG. 1). Likewise, certain elements of the plasma generator equipment may be shared amongst process stations (e.g., power supplies), although depending on the embodiment, certain aspects may be process station-specific (for example, if showerheads are used to apply plasma-generating electrical potentials—see the discussion of FIG. 1 below). Once again, however, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

Parallel Substrate Deposition Operational Sequences in a 4 Station Chamber

As stated, processing multiple substrates at multiple process stations within a common substrate processing chamber may increase throughput by enabling film deposition to proceed simultaneously and in parallel on multiple substrates while at the same time utilizing common processing equipment between the various stations.

FIG. 2A shows an example of a processing apparatus suitable for such purposes where a substrate loading device, in this case substrate handler robot 226, is used for loading substrates at process stations 201 and 202, and a substrate transferring device, in this case substrate carousel 290, is used for transferring substrates between the various process stations 201, 202, 203, and 204. Given this configuration of process stations and substrate loading and transferring devices, a variety of process sequences are possible which allow film deposition—say N cycles of film deposition—to occur in parallel across multiple substrates.

For instance, one approach will be referred to as a so-called "static mode." In "static mode," the chamber is opened via port 220, wafers are loaded at all 4 stations, the chamber is closed, N deposition cycles are performed on all 4 wafers in parallel, the deposition cycles conclude, the chamber is opened, and the 4 wafers are removed.

In the embodiment shown in FIG. 2A, the substrate loading device is depicted as substrate handler robot 226 having 2 arms for substrate manipulation, and so, as depicted, it could load substrates at both stations 201 and 202 (perhaps simultaneously, or perhaps sequentially). Then, after loading at stations 201 and 202, the substrate transferring device, carousel 290 depicted in FIG. 2A, can do a 180 degree rotation (about its central axis, which is substantially perpendicular to the plane of the substrates (coming out of the page), and substantially equidistant between the substrates) to transfer the two substrates from stations 201 and 202 to stations 203 and 204. At this point, handler robot 226 can load 2 new substrates at stations 201 and 202, completing the loading process. To unload, these steps can be reversed, except that if multiple sets of 4 wafers are to be processed, each unloading of 2 substrates by handler robot 226 would be accompanied by the loading of 2 new substrates prior to rotating the transferring carousel 290 by 180 degrees. Analogously, a one-armed handler robot configured to place substrates at just 1 station, say 201, would be used in a 4 step load process accompanied by 4 rotations of carousel 290 by 90 degrees to load substrates at all 4 stations.

In any event, in this so-called "static mode" just described, each substrate receives its film deposition entirely (all N cycles) at 1 of the 4 processing stations. However, it has oftentimes been found that more consistent film deposition may be achieved across different substrates if each substrate sees multiple process stations within the processing chamber—i.e., for each substrate, some portion of its film is deposited at one station, and some portion at one or more other processing stations. This results in an averaging-out of any systematic difference in deposition occurring at the different stations.

Such deposition averaging amongst stations may be achieved using various process sequences that differ from the basic "static mode" just described. For example, in one scheme of operation referred to as "Sequential mode," N cycles of deposition are performed in the processing chamber in alternation with 90 degree transferring carousel rotations so that each wafer sees N cycles of deposition at each of the 4 stations. In detail, in this mode of operation, a first substrate is loaded via handler robot 226 at station 201, N deposition cycles are performed (which only deposit onto this first substrate), carousel 290 is rotated 90 degrees moving the first substrate to station 202, a second substrate is loaded at station 201, another N deposition cycles are performed (this time depositing on both the first and second substrates), and so forth, until the first substrate has experienced N cycles of deposition at each of processing stations 201, 202, 203, and 204, the second substrate N cycles at each of stations 201, 202, and 203 with deposition at 204 to occur next, and so forth. Note that in total, each substrate will thus receive a total of 4N cycles of film deposition.

Relative to "static mode," "Sequential mode" is beneficial in the sense that each wafer sees each station to the same extent; however other characteristics of this mode of operation make it less appealing. First and foremost, Sequential mode involves a great deal of substrate loading/unloading, "indexing"—i.e., the transferring of substrates from one process station to another, and opening/closing of processing chamber port 220. In particular, it is noted that for a substrate to receive its allotted 4N depositions over the 4 stations, the processing chamber has to be opened and closed for loading/unloading operations 4 times, each time accompanied by restoration of the environment on chamber's interior back to deposition-appropriate environmental conditions (e.g., temperature, pressure, flow rates, etc.). Static mode, when using one station for loading operations, may involve the same amount of indexing—using 90 degree transfer rotations—to get 4 wafers into position for deposition, but the chamber is only opened and closed once since in static mode no intervening depositions are performed between the transfer rotations. Thus, loading of all four wafers (one by one) into the multi-station chamber prior to deposition is also possible but also results in a significantly longer overhead time caused by additional indexing steps.

Damascene Mode Substrate Deposition Operational Sequences in a 4 Station Chamber An alternative scheme of deposition operation may be referred to as "Damascene mode." Damascene mode allows each wafer to see each station to about the same extent, but avoids the repeated opening and closing of the processing chamber for the loading/unloading operations.

Figure 2B:
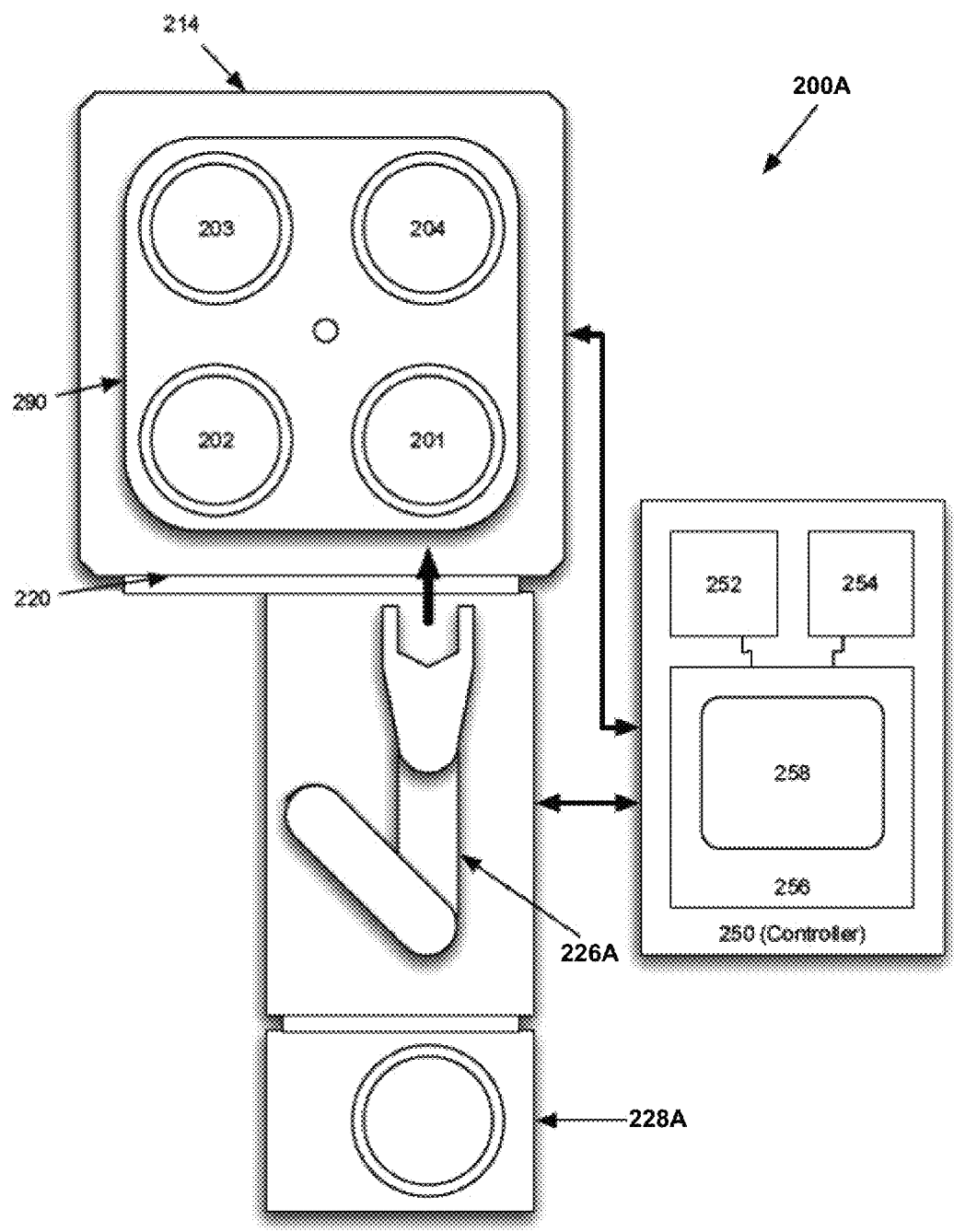
FIG. 2B is a schematic of a four-station substrate processing apparatus having a substrate handler robot for loading and unloading substrates from one process station and a controller for operating the apparatus.

FIG. 2B shows an example of a processing apparatus suitable for Sequential or Damascene mode. In FIG. 2B, multi-station substrate processing apparatus 200A is similar to the multi-station substrate processing apparatus 200 shown in FIG. 2A. However, handler robot 226A is different from handler robot 226 in that handler robot 226A as depicted in FIG. 2B has a single arm for substrate manipulation. In alternative embodiments, the handler robot 226A may have multiple arms for substrate manipulation. Handler robot 226A in FIG. 2B may load between one to four substrates into stations 201-204.

A difference between Sequential mode and Damascene mode is that in Sequential mode, only one substrate may be initially loaded, with additional substrates loaded after indexing between cycles of deposition. In Damascene mode, a full set of substrates may be loaded into the processing chamber before the set of substrates is processed. After the substrates are loaded into the stations, N deposition cycles may be performed. After the N deposition cycles are performed, carousel 290 may then be rotated 90 degrees and N' deposition cycles may be performed and so forth, until each of the four substrates has experienced N, N', N", and N'" cycles of deposition at each of processing stations 201, 202, 203, and 204. For certain film target thicknesses, N, N', N", and N'" may all be the same number, but for many thicknesses, some or all N', N", and N'" may differ in value from N. Generally, N', N", and N'" may have values of N, N+1, or N−1, but certain implementations may have N', N", and N'" that differ from N in greater values. For example, certain embodiments may have N', N", or N" be values of N, N+1, N+2, N+3, N−1, N−2, or N−3.

2×2 Mode of Substrate Deposition

Yet another scheme of operation is the so-called "2×2 mode." In 2×2 mode, alternating load/deposition steps are employed much like Sequential mode, but a 2-substrate loading device is used—such as substrate handler robot 226 shown in FIG. 2A—for simultaneous loads/unloads at 2 process stations. In so doing, the number of load/unload steps and opening and closing of the chamber is cut down by half, and the amount of indexing is also reduced by half due to 180 degree transfer rotations between process stations. Thus, the 2×2 mode involves loading 2 substrates at a time, and processing each substrate with 2 deposition sequences (and hence "2×2").

Illustrated Example of 2×2 Mode of Substrate Deposition

Figure 3A:
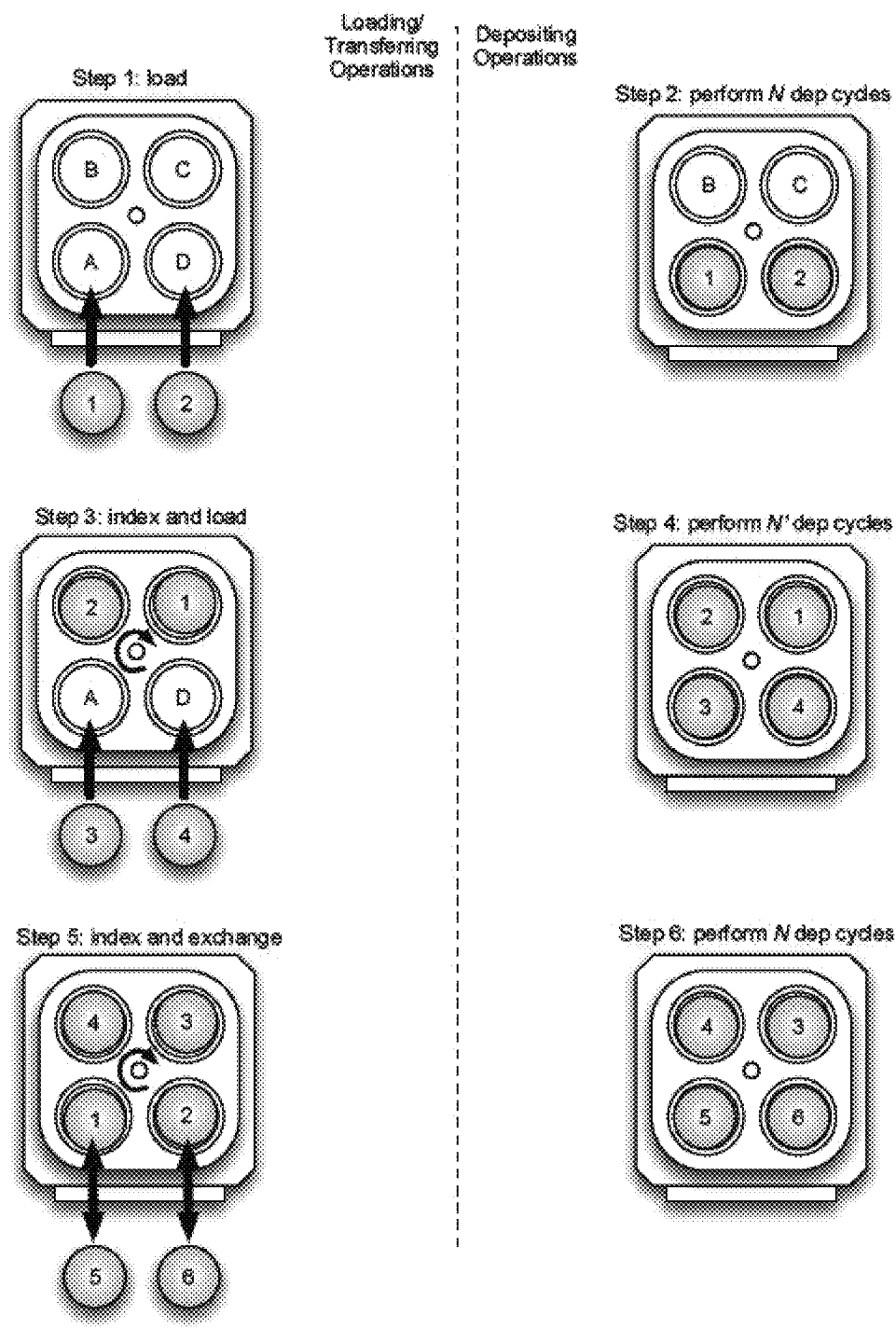
FIG. 3A shows an example of the sequence of operations representing 2×2 mode (or 2×2 "flex" mode).

An example of the sequence of operations representing 2×2 mode is illustrated in FIG. 3A. Note that stations 901-904 have been re-labeled A-D in FIG. 3A for simplicity.

Referring to FIG. 3A, in Step 1 substrates 1 and 2 are loaded by a substrate loading device (not shown) at stations A and D, and in Step 2, N cycles (e.g., ALD cycles) of deposition are performed to deposit N layers of film (e.g., dielectric film) on substrates 1 and 2. In Step 3, substrates 1 and 2 are rotated (indexed) 180 degrees (as indicated by the curved arrow) to positions C and B, respectively, by a substrate transferring device (not shown) and N' cycles of film deposition are performed depositing material on each of substrates 1, 2, 3, and 4. Typically, the number of deposition cycles performed in Steps 2 and 4 would be the same leaving, at the conclusion of Step 4, substrates 1 and 2 with 2N layers of deposited film, and substrates 3 and 4 with N layers of film. However, in some embodiments, N and N' are chosen to be different, as explained in further detail below. In any event, in Step 5, substrates 3 and 4 are rotated to stations C and B, respectively, and substrates 1 and 2 are exchanged with new substrates 5 and 6 (i.e., 1 and 2 are unloaded and 5 and 6 are loaded at stations A and D). Finally, in Step 6, substrates 3 and 4 receive their second round of deposition, this time N cycles, while new substrates 5 and 6 receive their first round of deposition cycles, also N cycles. Note, that the process can be continued indefinitely to process as many substrate pairs as desired. Also note, once again, that each completely processed wafer has received film deposition at 2 process stations, either A and C, or D and B. Thus, 2×2 mode represents an efficient and workable compromise between processing speed and averaging deposition over multiple process stations.

Illustrated Example of Sequential Mode of Substrate Deposition

Figure 3B:
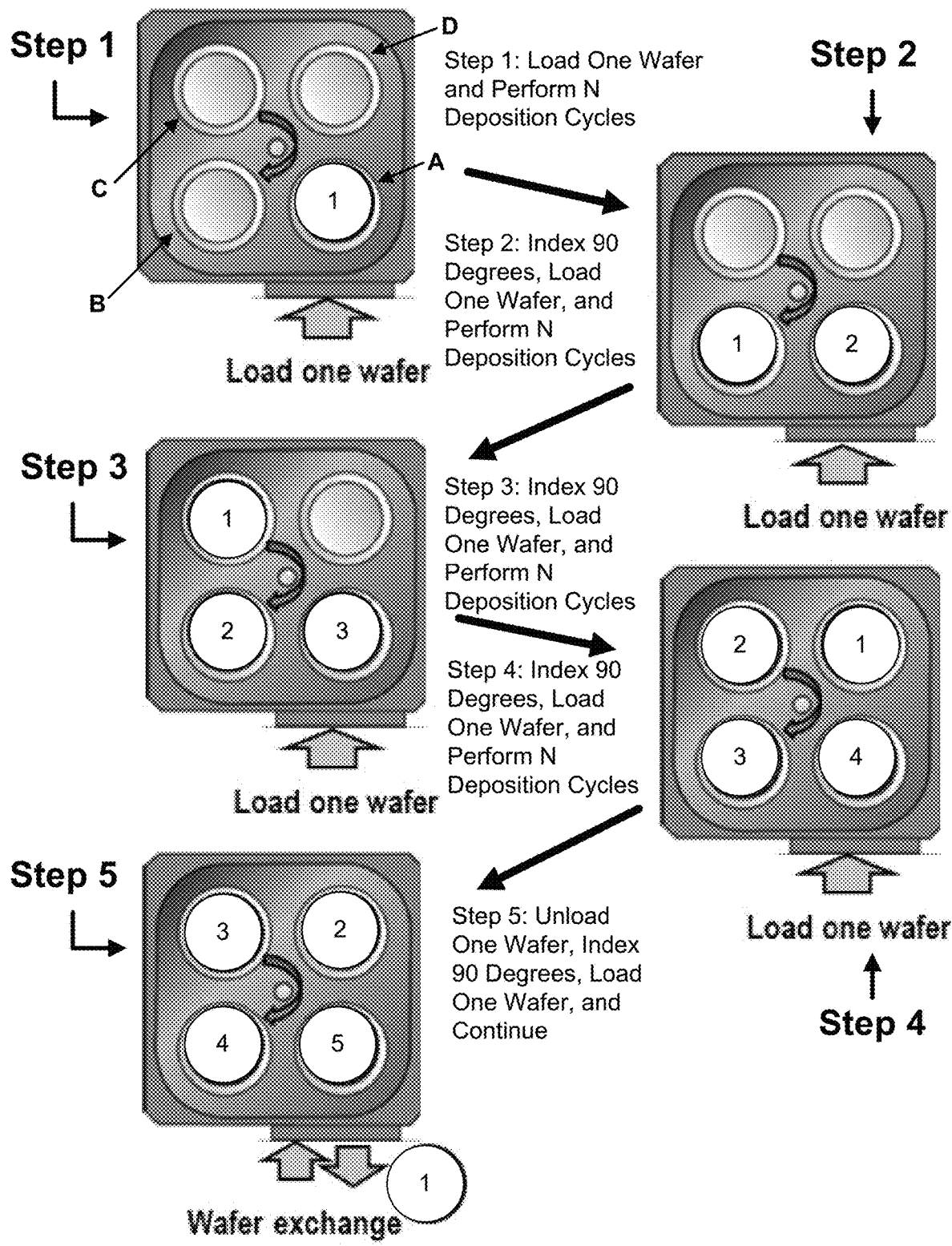
FIG. 3B shows an example of a sequence of operations representing a typical deposition mode.

An example of the sequence of operations representing Sequential mode is illustrated in FIG. 3B. As in FIG. 3A, stations 901-904 have been re-labeled A-D in FIG. 3B for simplicity. Referring to FIG. 3B, in Step 1, substrate 1 is loaded by a substrate loading device (not shown) at station A and N cycles of deposition are performed to deposit N layers of film on substrate 1. In Step 2, substrate 1 is rotated (indexed) 90 degrees (as indicated by the curved arrow) to station B and substrate 2 is loaded by the substrate loading device at station A. After substrate 1 is rotated and substrate 2 is loaded, N cycles of film deposition are performed depositing material on each of substrates 1 and 2. In Step 3, substrates 1 and 2 are rotated to stations C and B, respectively, and substrate 3 is loaded by the substrate loading device at station A before N cycles of film deposition are performed on each of substrates 1, 2, and 3. In Step 4, substrates 1, 2, and 3 are rotated to stations D, C, and B, respectively, and substrate 4 is loaded by the substrate loading device at station A before N cycles of film deposition are performed on each of the substrates 1, 2, 3, and 4. In Step 5, the substrates are rotated a further 90 degrees so that substrate 1, 2, 3, and 4 are at stations A, D, C, and B, respectively. After rotation, substrate 1 is then unloaded by the substrate loading device from station A before substrate 5 is loaded into station A and N cycles of film deposition are performed. The process may then continue through additional indexing, loading and unloading of substrates, and film deposition cycles. The process may be continued indefinitely to process as many substrates as desired.

In certain embodiments of Sequential Mode, the number of deposition cycles performed in each step of Steps 1-4 may vary in value. For example, the number of deposition cycles performed in Step 1 may be N, the number of deposition cycles performed in Step 2 may be N', the number of deposition cycles performed in Step 3 may be N'', and the number of deposition cycles performed in Step 4 may be N'''.

N, N', N'', and N''' may vary in the same manner as that described elsewhere in this disclosure. The disclosed approach permits at least two options for tailoring deposition to film target thickness: (a) the choice of N', N'', and/or N''', and (b) the number of stations where the number of deposition cycles is not N. For example, in a four station reactor, N' (not equal to N) cycles may be used in one, two, or three stations.

Sequential Mode allows each substrate to see each station for the same number of deposition cycles. However, as mentioned, Sequential mode involves a great deal of substrate loading/unloading, indexing, and opening/closing of the processing chamber.

Illustrated Example of Damascene Mode of Substrate Deposition

Figure 3C:
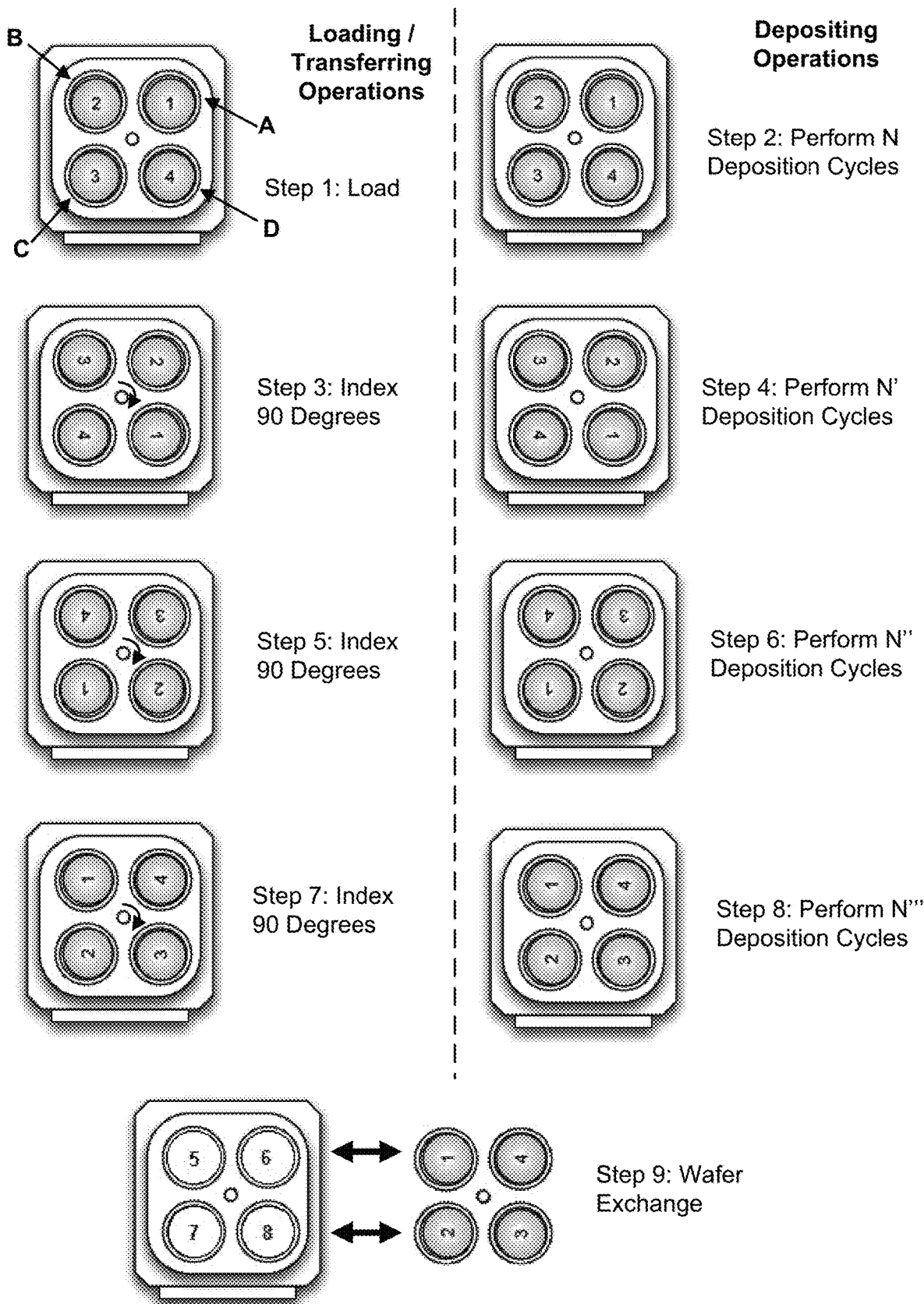
FIG. 3C shows an example of a sequence of operations representing a Sequential mode.

An example of the sequence of operations representing Damascene mode is illustrated in FIG. 3C. As in FIG. 3A, stations 901-904 have been re-labeled A-D in FIG. 3C for simplicity. Referring to FIG. 3C, in Step 1, substrates 1, 2, 3, and 4 are all loaded by a substrate loading device (not shown) into stations A, B, C, and D, respectively. In Step 2, N cycles of deposition are performed to deposit N layers of film on substrates 1, 2, 3, and 4. In Step 3, substrates 1, 2, 3, and 4 are rotated (indexed) 90 degrees (as indicated by the curved arrow) to stations D, A, B, and C, respectively. In Step 4, N' cycles of deposition are performed to deposit N' layers of film on substrates 1, 2, 3, and 4. In Step 5, substrates 1, 2, 3, and 4 are rotated 90 degrees to stations C, D, A, and B, respectively. In Step 6, N'' cycles of deposition are performed to deposit N'' layers of film on substrates 1, 2, 3, and 4. In Step 7, substrates 1, 2, 3, and 4 are rotated 90 degrees to stations B, C, D, and A, respectively. In Step 8, N''' cycles of deposition are performed to deposit N''' layers of film on substrates 1, 2, 3, and 4. In Step 9, substrates 1, 2, 3, and 4 are unloaded from the processing chamber and a fresh set of substrates, substrates 5, 6, 7, and 8, are loaded into the processing chamber. The process may then be repeated with substrates 5, 6, 7, and 8 and may continue indefinitely until the desired number of substrates have been processed.

Damascene mode allows for flexibility in the total number of cycles performed. In certain semiconductor processing modes, the total number of cycles may be limited to a number that is a multiple of the number of stations the substrates see during deposition. In such a case, if, for example, each cycle deposits 1.62 Å of material on a substrate, the process illustrated in FIG. 3B may be limited in substrate target thickness levels of multiples of 6.48 Å. By contrast, for example, for the Damascene mode described, N' may be the same as N, or may be N−1 or N+1. N'' and N''' may also be each to N, N−1, or N+1. In the example illustrated in FIG. 3C, the following number of cycles performed at each station may be possible:

| Variable: | Possible Values | | | |
|---|---|---|---|---|
| N = | N | N | N | N |
| N' = | N +/− 1 | N | N | N |
| N'' = | N +/− 1 | N +/− 1 | N | N |
| N''' = | N +/− 1 | N +/− 1 | N +/− 1 | N |

Thus, Damascene mode (and certain embodiments of Sequential mode) allows control of the substrate target thickness down to the thickness of one cycle of deposition, for example 1.62 Å. Additionally, in a typical semiconductor processing operation, the number of cycles each substrate sees at each station may be fairly high. For example, N, as mentioned in the paragraph above, may be over 100 in certain semiconductor processing operations. When such a high number of cycles is performed at each station, a addition or subtraction of one or two or single digit number of cycles experienced at a particular station will not contribute significantly to wafer to wafer and point to point accuracy. Thus, Damascene mode allows each substrate to see about the same number of deposition cycles from each station. Finally, because sets of substrates are loaded and unloaded together in Damascene mode, the loading/unloading and closing/opening of the processing chamber is greatly reduced.

The exact values of N, N', N'', N''', etc. may be selected depending on the target film thickness. Processes with different target film thicknesses may have different values of of N, N', N'', N''', etc. in order to best match the target film thickness. The relationship between N, N', N'', N''', etc., i.e., whether the of N' is equal to N, N−1, or N+1, may also depend on the target film thickness.

Various features of 2×2, Sequential, and Damascene Modes may be combined together. For example, a deposition mode may combine the loading and unloading of a single substrate after each step or after each occurrence of indexing as illustrated in the Sequential Mode with the uneven number of deposition cycles for different steps as illustrated in the Damascene Mode. Thus, for example, if a deposition mode includes four process stations, the substrates may be indexed and a substrate may be loaded and/or unloaded after each process step. In three of the process steps, N cycles of deposition may occur. However, on every fourth process step, N+1 cycles of deposition may occur. Other embodiments of such a deposition mode may vary the number of process steps with N+1 cycles of deposition or may have certain process steps with N−1 cycles of deposition instead of N+1 cycles of deposition.

Improving Target Thickness Accuracy of 2×2 Mode

Referring back to FIG. 3A, it was stated above that the number of deposition cycles N performed during Step 2 may be the same or different than the number of deposition cycles N' performed during Step 6. It turns out that through judicious choice of N and N' the thickness accuracy of the 2×2 processing mode may be enhanced by up to approximately a factor of 2 without any substantial impact on processing throughput. This can be accomplished as follows.

Generally, if a substrate receives a sequence of deposition cycles at multiple processing stations, then the total number of layers of film deposited on the substrate is the product of the number of processing stations seen by the wafer and the number of cycles performed at each processing station. Thus, in the case of 2×2 mode, generally, each substrate receives N deposition cycles at 2 processing stations, and so the total deposited film is composed of 2N layers and has a thickness of 2N*d, where d is the average thickness of a single layer (i.e., d is the deposition rate per cycle). Thus, while the resulting 2-station averaging improves film thickness uniformity between substrates, it also means that control of thickness accuracy is now limited to 2*d. For instance, when depositing dual patterning oxide films via ALD, the thickness d of a single ALD-deposited layer (i.e., the film resulting from a single ALD cycle) may be approximately 1.62 Å (Angstrom). Hence, target thicknesses can only be selected from integer multiples of 2*d=3.24 Å (giving a best theoretical thickness accuracy is ±1.62 Å). Static mode, by comparison, where each substrate is deposited upon at a single processing station, can by default control film thickness accuracy in integer multiples of d=1.62 Å.

Stating it another way, in the standard procedure, for a given target thickness D, one chooses N, the number of deposition cycles, such that 2N*d is as close to D as possible, which means that control of film thickness is limited to integer multiples of 2*d. However, a "2×2 flex mode" provides thickness control to an accuracy of 1*d within the same basic 2×2 flex mode procedure outline above. This is accomplished by, in certain prescribed circumstances, using a different number of deposition cycles at one of the two processing stations seen by each wafer. Thus, referring again to FIG. 3A, in the modified "2×2 flex mode" procedure, Step 2 performs N cycles of film deposition, but Step 4 performs N' cycles of film deposition where N' can be different from N. The result is that substrates 1 and 2 see a total of N+N' cycles of film deposition and have a resulting film thickness of (N+N')*d. Furthermore, in the next deposition step, Step 6 of FIG. 3A, N deposition cycles of deposition are again performed so that the next pair of substrates, substrates 3 and 4, also see a total of N'+N=N+N' cycles, and so, by alternating the deposition steps between using N or N' cycles, each subsequent pair of wafers will be processed with the same total number of deposition steps.

The question is then how to optimally choose N and N'. In the standard procedure, no distinction is made between N and N' and so the total deposited film thickness is always 2N*d—an even integer multiple of d—as stated above. Here, in the modified 2×2 flex mode procedure, N' may be chosen different than N, for example, to be N+1, and so the resulting film thickness may be chosen to be (N+N+1)*d= (2N+1)*d—i.e., an odd integer multiple of d. Thus, in the flex mode procedure, the total number of deposition cycles can be chosen to be odd or even depending on whether N' is chosen equal to N or N+1 or N−1, and this allows thickness control down to the resolution of one deposition cycle.

The 2×2 flex mode procedure is thus as follows: For a given target film thickness D, one determines whether the closest positive integer M to D/d is odd (d being the anticipated mean thickness of a layer of film deposited by a single cycle of film deposition) and if M is odd, one then chooses N and N' such that N+N'=M and |N−N'|=1. On the other hand, if M is even, one chooses N and N' such that N=N'=½*D/d.

Alternatively, a 2×2 flex mode procedure may also be viewed and performed as follows: Choose a target thickness D of the deposited film and choose N to be the closest positive integer to ½*D/d (where, again, d is the anticipated mean thickness of a layer of film deposited by a single cycle of film deposition). Then choose N' to be either N−1, N, or N+1 based on the following criteria:

choose N' to be N when |Δ|<d/2;

otherwise, when |Δ|>d/2, choose N' to be N−1 when Δ>0 or N+1 when Δ<0;

where Δ=2N*d−D. The labels N and N' may, of course, be switched without changing the substance of the technique. For example, after making the foregoing determinations, N' may be used in Step 2 of FIG. 3A and N in Step 4 of FIG. 3A without altering the principles disclosed herein or changing the scope of the methods encompassed by the foregoing description. Note that the above criteria and its evaluation may be implemented as machine readable instructions residing on (and/or accessible by) a controller of a multi-station substrate processing apparatus or be embodied in non-transitory machine-readable media, for example, memory devices/chips, discs, etc. readable, for example by a system controller.

Figure 4A:
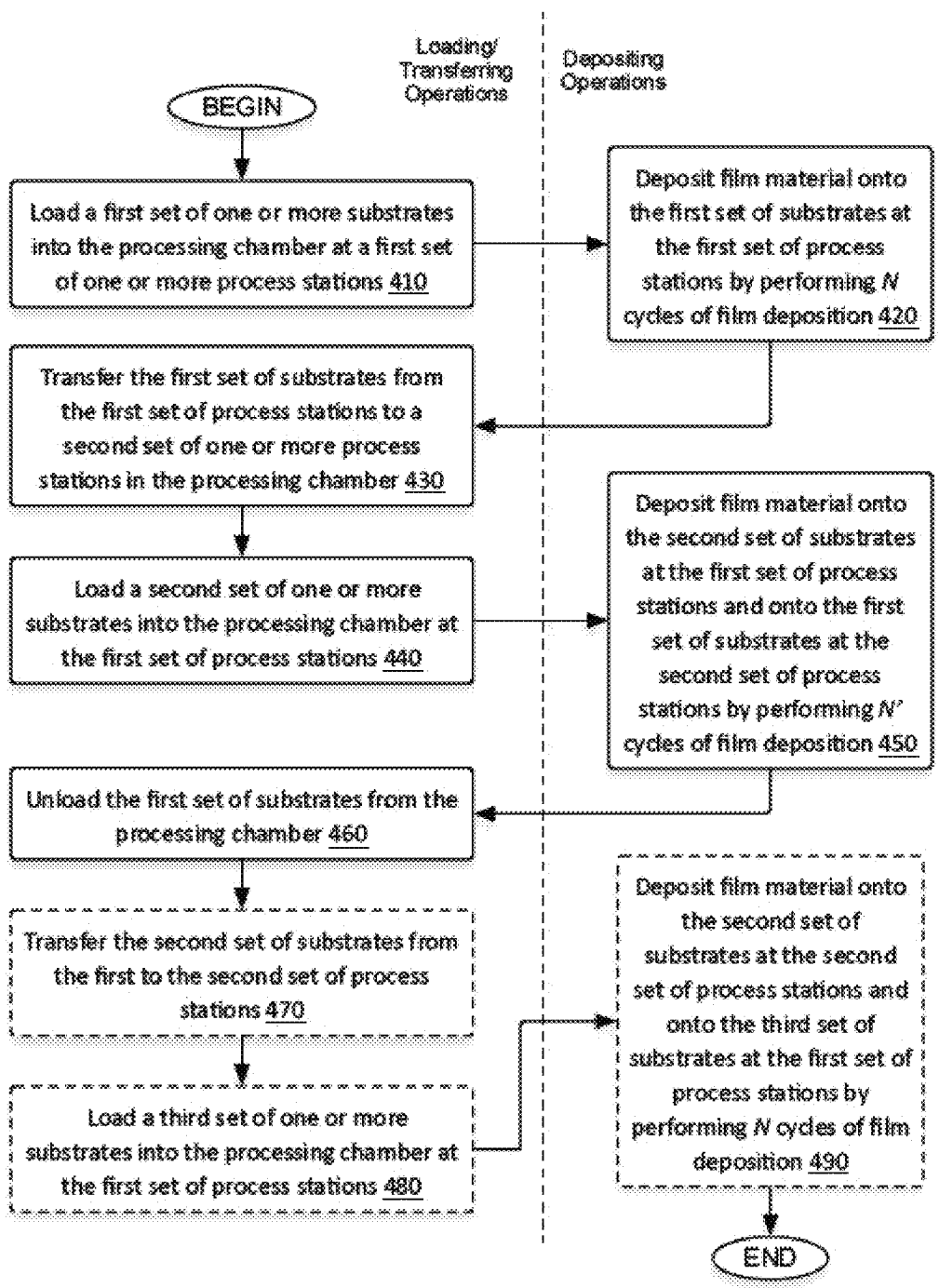
FIG. 4A is a flowchart of an example of a methodology for depositing films of material on multiple semiconductor substrates in a multi-station processing chamber based on the principles disclosed herein.

An example of an methodology for depositing films of material on multiple semiconductor substrates in a multi-station processing chamber based on the foregoing principles is schematically illustrated in FIG. 4A. Examples of suitable apparatuses are described in detail below. As shown in the figure, and as also indicated in FIG. 3A, the methods may be viewed as having substrate loading/transferring operations as shown to the left of the vertical dashed line and depositing operations as shown to the right of the vertical dashed line.

Referring to FIG. 4A, in some embodiments, a method may begin at Operation 410 by loading a first set of one or more substrates into a processing chamber at a first set of one or more process stations. (This first set of stations could be stations 201 and 202 from FIG. 2A or stations D and A from FIG. 3A.) The method may then proceed by depositing film material in Operation 420 onto the first set of substrates at the first set of process stations by performing N cycles of film deposition. (See also, Steps 1 and 2 and so forth, from FIG. 3A.) After the depositing in Operation 420, the first set of substrates may be transferred in Operation 430 from the first set of process stations to a second set of one or more process stations in the processing chamber, and in Operation 440, a second set of one or more substrates may be loaded into the processing chamber at the first set of process stations. With both sets of substrates now loaded into the processing chamber, another round of deposition may proceed in Operation 450 by depositing film material onto the second set of substrates at the first set of process stations and onto the first set of substrates at the second set of process stations by performing N' cycles of film deposition. As discussed in detail above, in some embodiments, N' may be chosen not equal to N in order to improve the thickness accuracy of the deposited film. Finally, after this deposition step, in Operation 460, the first set of substrates may be unloaded from the processing chamber. (In some embodiments, this may occur by transferring them back to the first process station where they are accessible by a substrate loading device, such as the substrate handler robot 226 shown in FIG. 2A.) At this point, the first set of substrates have had a complete film deposition sequence performed and have exited the processing chamber. To complete the film deposition sequence with respect to the second set of substrates, in optional Operation 470 (as indicated by the dashed line), the second set of substrates may be transferred from the first to the second set of process stations for their second set of deposition cycles. At this point, if there are additional substrates in the batch of substrates being processed, a third set of substrates may be loaded into the processing chamber at the first set of process stations in Operation 480. Then, in Operation 490, film material may be deposited onto the second set of substrates at the second set of process stations and optionally onto the third set of substrates at the first set of process stations by performing N cycles of film deposition. (Again, see the discussion above in the context of FIG. 3A regarding alternating between N and N' cycles of deposition.) The sequence in FIG. 4A may be continued to conclude deposition on the third set of substrates (it would be N' cycles of deposition in the third set's second round of deposition cycles) and to process additional sets of substrates in the batch, e.g., a fourth set, a fifth set, and so forth.

Figure 4B:
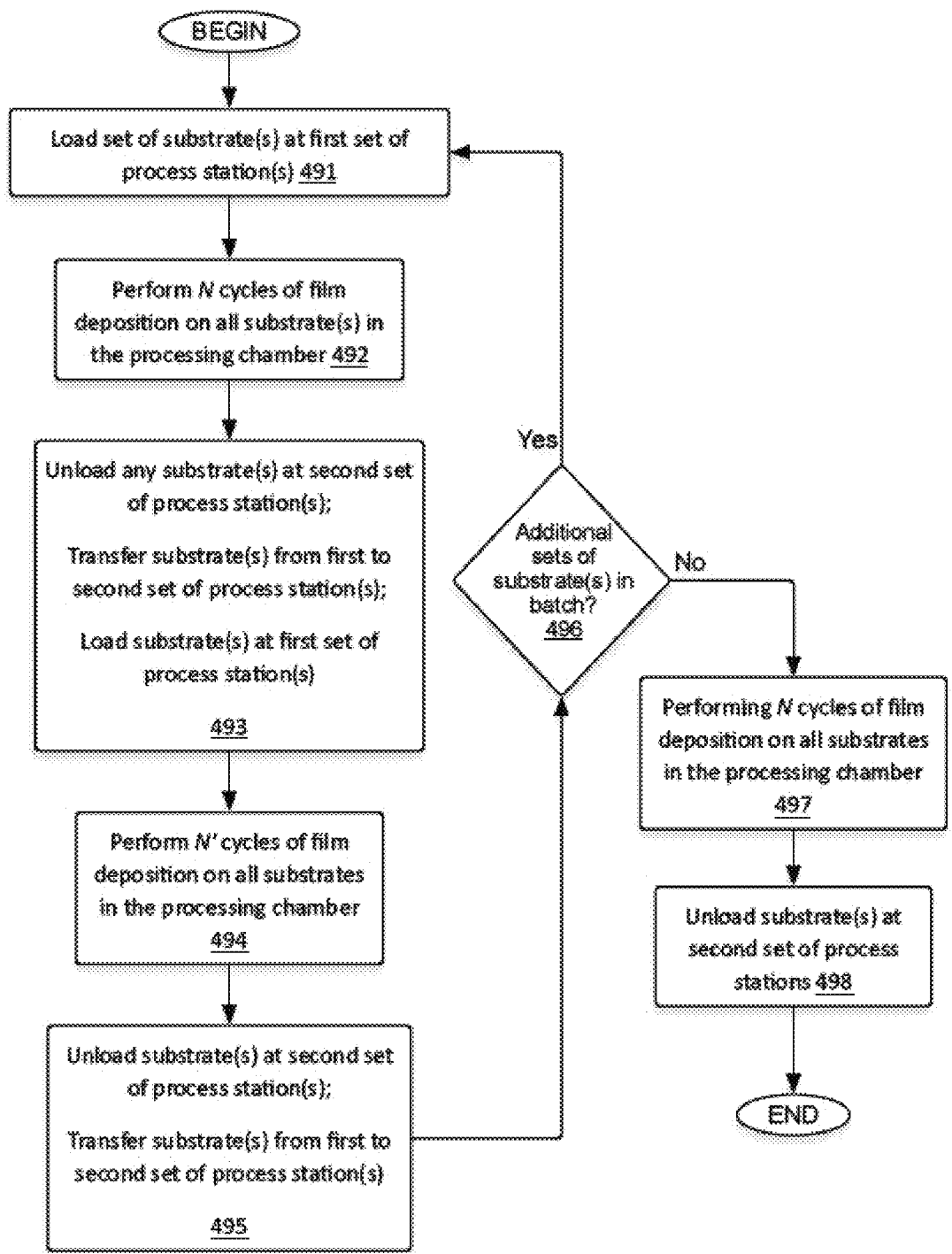
FIG. 4B is a flowchart of an example sequence of operations for depositing onto an arbitrary number of sets of one or more substrates using alternating rounds of N and N' cycles of deposition.

FIG. 4B further illustrates such multi-station film deposition methodologies for depositing onto an arbitrary number of sets of one or more substrates using alternating rounds of N and N' cycles of deposition. The set of operations shown in FIG. 4B begins with Operation 491 of loading a set of substrates at a first set of process station(s). (Note that a set of substrates may be just one substrate, and a set of process stations may be just one process station.) In this and other embodiments, typically the number of substrates in each set is equal, and all process stations in the chamber are utilized in each step (except during the beginning or ending of a sequence).

Film deposition then occurs in Operation 492 which involves performing N cycles of film deposition on all substrates in the processing chamber. If the substrate(s) loaded in Operation 491 constitute the first set of the batch, then presumably the processing chamber was otherwise empty, and thus this first set of substrate(s) loaded at the first set of process station(s) will be the only substrates deposited upon in this round of Operation 492. However, if another set of substrate(s) is present in the chamber—e.g., because the set just loaded in Operation 491 was not the first set in the batch—then presumably these other substrate(s) within the processing chamber will also be deposited upon in Operation 492. And, these other substrate(s) are located at a second set of process station(s) during Operation 492, already having been deposited upon at the first set of process station(s) in a prior operation. Thus, in Operation 493, substrate(s) at the second set of process station(s) are unloaded, the substrate(s) at the first set of process station(s) are transferred to the second set of process station(s), and a new set of substrate(s) are loaded at the first set of process station(s).

Now, with the substrates at their new stations, another round of film deposition is performed in Operation 494: specifically, N' cycles of film deposition are performed on all substrates in the processing chamber. Thus, the substrate(s) just transferred from the first set of process station(s) to the second set of process station(s) have now had a total of N+N' cycles of film deposition performed on them. At this point, they are unloaded from the second set of process station(s) in Operation 495, Operation 495 also including transferring substrate(s) from the first set of process station(s) to fill the now vacated second set.

At this point, at least one set of substrate(s) have been fully deposited upon (having received N+N' cycles of deposition, where N may or may not be equal to N') and have been unloaded from the processing chamber. Thus, in Operation 496, it is determined whether the batch of substrates being processed contains an additional set of substrates which has not yet been processed. If so, the operational sequence returns to Operation 491 to repeat the foregoing steps to process the new set; and to finish processing the preceding set which will initially (during Operations 491 and 492) be located at the second set of process station(s). If there is no additional set of substrates in the batch designated for processing, then what is left is to finish up with the set still present at the second set of process station(s) (having been transferred there in Operation 495). Thus, N cycles of film deposition are performed in Operation 497, and in Operation 498 these substrate(s) are finally unloaded, having received their full prescription of N'+N cycles of film deposition.

It is noted that the above procedure (e.g., FIGS. 4A and 4B) may be performed in processing chambers having more or less than 4 process stations—such as 2 or 6 or 8 or 10 or 12 or 14 or 16 process stations. Generally, an even number of process stations would be employed so that the first and second sets of process stations discussed above may have equal numbers. Thus, a processing chamber used to perform film deposition operations in the 2×2 mode and/or flex mode would typically contain an even number of process stations S, where each of the first and second sets of process stations have S/2 process stations. However, the presence of an extra process station (i.e., an odd number of process stations) within a processing chamber would not prevent the operation of the disclosed techniques. It is also noted that the above described "flex mode" also works in an analogous manner in a "2×4 mode" of processing, where 2 wafers are loaded at the same time and 4 deposition steps are performed.

Figure 4C:
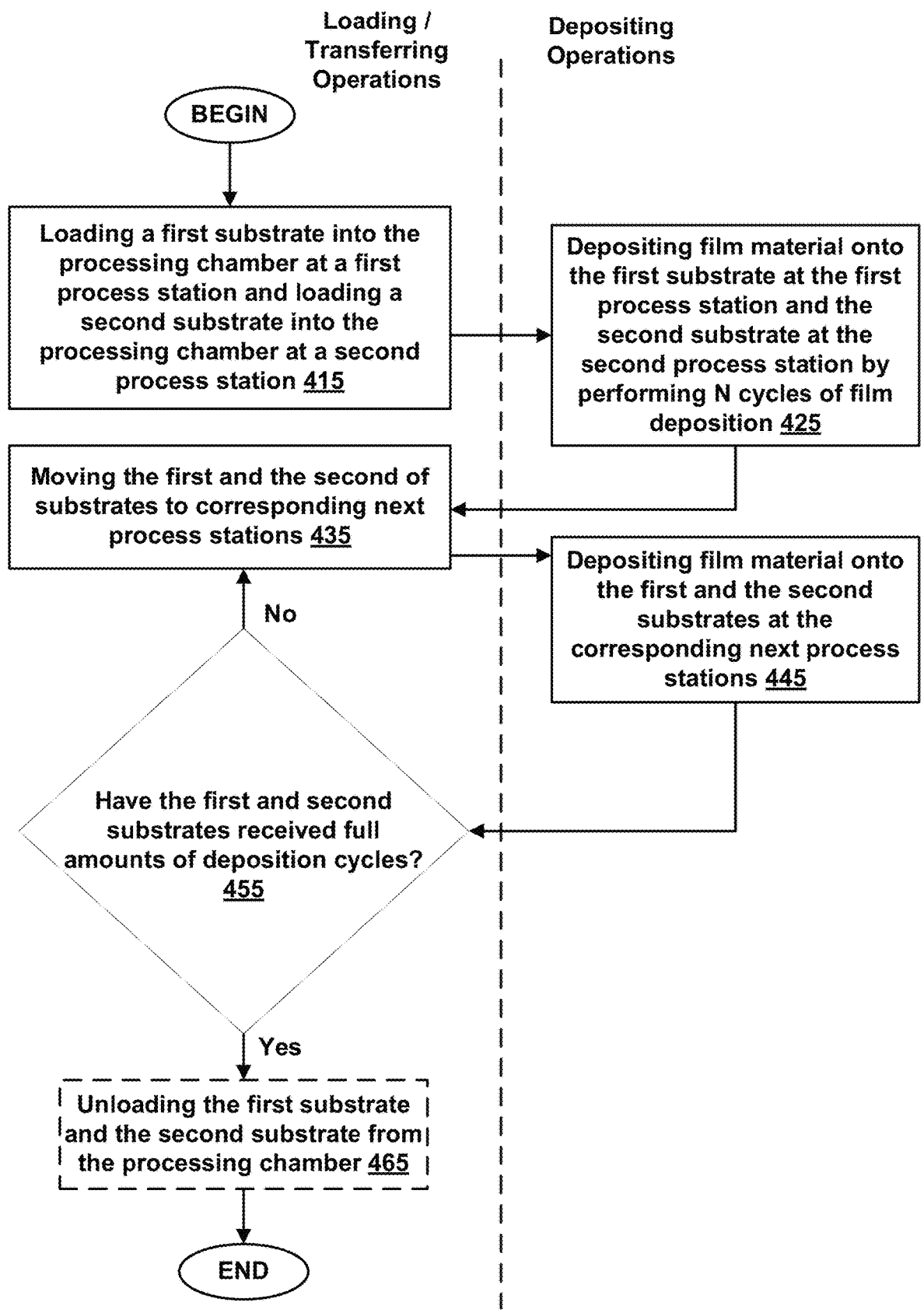
FIG. 4C is a flowchart of an example of a methodology for depositing films of material on multiple semiconductor substrates in a multi-station processing chamber based on the Damascene model.

An example methodology for depositing films of material on multiple semiconductor substrates in a multi-station processing chamber based on the Damascene mode outlined above is schematically illustrated in FIG. 4C. FIG. 4C illustrates the Damascene mode as applied to an example semiconductor processing chamber with two process stations.

Referring to FIG. 4C, in some embodiments, a method may begin at Operation 415 by loading a first substrate into a processing chamber at a first process station and a second substrate into the processing chamber at a second process station. The method may then proceed by depositing film material in Operation 425 onto the first and second substrates at the first and second process stations, respectively, by performing N cycles of film deposition. After the depositing in Operation 425, the first substrate may be transferred in Operation 435 from the first process station to a next process station and the second substrate may be transferred from the second process station to another next process station. After Operation 435, another round of deposition may proceed in Operation 445 by depositing film material onto the second substrate at the first process station and onto the first substrate at the second process station by performing N' cycles of film deposition. As discussed in detail above, in some embodiments, N' may be N, N−1, or N+1. Following Operation 445, Operation 455 checks to see if the first and second substrates have received all their scheduled deposition cycles. If they have not, the method returns to Operation 435 to once again rotate the first and second substrates to their corresponding next process stations.

If it is determined in Operation 455 that the first and second substrates have had a complete film deposition sequence performed, the method may proceed to optional Operation 465. In optional Operation 465, the first and second substrates may then be unloaded from the processing chamber. The sequence in FIG. 4C may be repeated to process additional substrates in the batch, e.g., a third substrate, a fourth substrate, and so forth, until the desired number of substrates have been processed.

In certain embodiments of the above methodology, substrates may be loaded, transferred, and receive film material as sets. For example, a first set of substrates may be loaded onto a first set of process stations, receive N deposition cycles at the first set of process stations, and then the first set of substrates may be transferred to a second set of process stations for further deposition cycles.

EXAMPLES

The following examples demonstrate theoretical film thickness improvements corresponding to various proposed target film thicknesses D (of 50 Å, 100 Å, 250 Å, and 300 Å). Whether standard 2×2 mode or 2×2 flex mode deposits a film having thickness closest to the target thickness D is indicated in the tables that follow. The tables corresponding to each example show: the given target thickness D; the thickness d of a film layer deposited via a single ALD cycle (the ALD film deposition rate per cycle); the 2*d thickness corresponding to a typical "2×2 ALD cycle"; the optimum number of ALD cycles corresponding to the two modes of operation—30 and 31 in Example 1 below; half of that number corresponding to 2×2 mode; a break down of the total number of ALD cycles (N+N') corresponding to the two modes of operation; and total deposited film thickness as well as deviation from target thickness D.

In reference to the discussion above, N is chosen to be the integer closest to ½*D/d (as indicated in the tables), and the N' corresponding to 2×2 flex mode is chosen to be N±1, depending on what is optimal. This brings the total number of ALD cycles performed to either 2N or 2N±1 depending on mode of operation as indicated in the tables. Note that for Examples 1 and 4, 2×2 flex mode is optimal, but for Examples 2 and 3 standard 2×2 mode provides the best result. In practice, film deposition methodologies may operate by performing these calculations (or the equivalent thereof) and choosing the optimal mode of operation accordingly.

Example 1

| Processing Mode: | 2 × 2 | 2 × 2$^{Flex}$ | Symbol |
|---|---|---|---|
| Target Film Thickness (Å) | 50 | 50 | D |
| Thickness/ALD Cycle (Å) | 1.62 | 1.62 | d |
| Two ALD Cycles Thickness (Å) | 3.24 | 3.24 | 2d |
| Total No. of ALD Cycles | 30 | 31 | 2N or 2N ± 1 |
| ½ ALD Cycles (Mode 2 × 2) | 15 | | N = D/2d |
| Total No. ALD cycles | 15 + 15 | 15 + 16 | |
| Actual Thickness (Å) | 48.60 | 50.22 | |
| Error Deviation from Target (Å) | −1.40 | 0.22 | |
| Optimal Processing Mode | | ✓ | |

Example 2

| Processing Mode** | 2 × 2 | 2 × 2$^{Flex}$ | Symbol |
|---|---|---|---|
| Target Film Thickness (Å) | 100 | 100 | D |
| Thickness/ALD Cycle (Å) | 1.62 | 1.62 | D |
| Two ALD Cycles Thickness (Å) | 3.24 | 3.24 | 2d |
| Total No. of ALD Cycles | 62 | 63 | 2N or 2N ± 1 |
| ½ ALD Cycles (Mode 2 × 2) | 31 | | N = D/2d |
| Total No. ALD cycles | 31 + 31 | 31 + 32 | |
| Actual Thickness (Å) | 100.44 | 102.06 | |
| Error Deviation from Target (Å) | 0.44 | 2.06 | |
| Optimal Processing Mode | ✓ | | |

Example 3

| Processing Mode** | 2 × 2 | 2 × 2$^{Flex}$ | Symbol |
|---|---|---|---|
| Target Film Thickness (Å) | 250 | 250 | D |
| Thickness/ALD Cycle (Å) | 1.62 | 1.62 | d |
| Two ALD Cycles Thickness (Å) | 3.24 | 3.24 | 2d |
| Total No. of ALD Cycles | 154 | 155 | 2N or 2N ± 1 |

-continued

| Processing Mode** | 2 × 2 | 2 × 2$^{Flex}$ | Symbol |
|---|---|---|---|
| ½ ALD Cycles (Mode 2 × 2) | 77 | | N = D/2d |
| Total No. ALD cycles | 77 + 77 | 77 + 78 | |
| Actual Thickness (Å) | 249.48 | 251.10 | |
| Error Deviation from Target (Å) | −0.52 | 1.10 | |
| Optimal Processing Mode | ✓ | | |

Example 4

| Processing Mode** | 2 × 2 | 2 × 2$^{Flex}$ | Symbol |
|---|---|---|---|
| Target Film Thickness (Å) | 300 | 300 | D |
| Thickness/ALD Cycle (Å) | 1.62 | 1.62 | d |
| Two ALD Cycles Thickness (Å) | 3.24 | 3.24 | 2d |
| Total No. of ALD Cycles | 186 | 185 | 2N or 2N ± 1 |
| ½ ALD Cycles (Mode 2 × 2) | 93 | | N = D/2d |
| Total No. ALD cycles | 93 + 93 | 93 + 92 | |
| Actual Thickness (Å) | 301.32 | 299.70 | |
| Error Deviation from Target (Å) | 1.32 | −0.30 | |
| Optimal Processing Mode | | ✓ | |

Detailed Description of Atomic Layer Deposition Techniques and Deposited Films

As discussed above, as devices sizes continue to shrink and ICs move to employing 3-D transistors and other 3-D structures, the ability to deposit a precise amount (thickness) of conformal film material—dielectrics in particular, but also various dopant-containing materials—has become increasingly important. Atomic layer deposition is one technique for accomplishing conformal film deposition that typically involves multiple cycles of deposition in order to achieve a desired thickness of film. ALD is often used to deposit the individual layers described in the above processes (e.g., those presented in the FIGS. 3 and 4 series).

In contrast with chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films having a variety of chemistries—and also many variations on the basic ALD process sequence—are described in detail in U.S. patent application Ser. No. 13/084,399, filed Apr. 11, 2011, titled "PLASMA ACTIVATED CONFORMAL FILM DEPOSITION", U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411 , U.S. patent application Ser. No. 13/224,240, filed Sep. 1, 2011, titled "PLASMA ACTIVATED CONFORMAL DIELECTRIC FILM DEPOSITION", and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION", each of which is incorporated by reference herein in its entirety for all purposes. As described in these prior applications, a basic ALD cycle for depositing a single layer of material on a substrate may include: (i) adsorbing a film precursor onto a substrate such that it forms an adsorption-limited layer, (ii) removing unadsorbed precursor from the volume surrounding the adsorbed precursor, (iii) reacting the adsorbed-precursor to form a layer of film on the substrate, and (iv) removing desorbed film precursor and/or reaction by-product from the volume surrounding the layer of film formed on the substrate. The removing in operations (ii) and (iv) may be done via purging, evacuating, pumping down to a base pressure ("pump-to-base"), etc. the volume surrounding the substrate. It is noted that this basic ALD sequence of operations (i) through (iv) doesn't necessary involve two chemiadsorbed reactive species P1 and P2 as in the example described above, nor does it even necessarily involve a second reactive species, although these possibilities/options may be employed, depending on the desired deposition chemistries involved.

Due to the adsorption-limited nature of ALD, however, a single cycle of ALD only deposits a thin film of material, and oftentimes only a single monolayer of material. For example, depending on the exposure time of the film precursor dosing operations and the sticking coefficients of the film precursors (to the substrate surface), each ALD cycle may deposit a film layer only about 0.5 to 3 Angstroms thick. Thus, the sequence of operations in a typical ALD cycle—operations (i) through (iv) just described—are generally repeated multiple times in order to form a conformal film of the desired thickness. Thus, in some embodiments, operations (i) through (iv) are repeated consecutively at least 1 time, or at least 2 times, or at least 3 times, or at least 5 times, or at least 7 times, or at least 10 times in a row. An ALD film may be deposited at a rate of between about 0.1 Å and about 2.5 Å per ALD cycle, or between about 0.2 Å and about 2.0 Å per ALD cycle, or between about 0.3 Å and about 1.8 Å per ALD cycle, or between about 0.5 Å and about 1.5 Å per ALD cycle, or between about 0.1 Å and about 1.5 Å per ALD cycle, or between about 0.2 Å and about 1.0 Å per ALD cycle, or between about 0.3 Å and about 1.0 Å per ALD cycle, or between about 0.5 Å and about 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma. The plasma may provide energy to drive the film-forming reaction on the substrate surface. In certain such embodiments, the plasma may be an oxidative plasma generated in the reaction chamber with application of suitable RF power (although in some embodiments, it may be generated remotely). In other embodiments, instead of an oxidative plasma, an inert plasma may be used. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Further variations on ALD processes are described in detail in the prior patent applications just cited (and which are incorporated by reference).

Figure 5A:
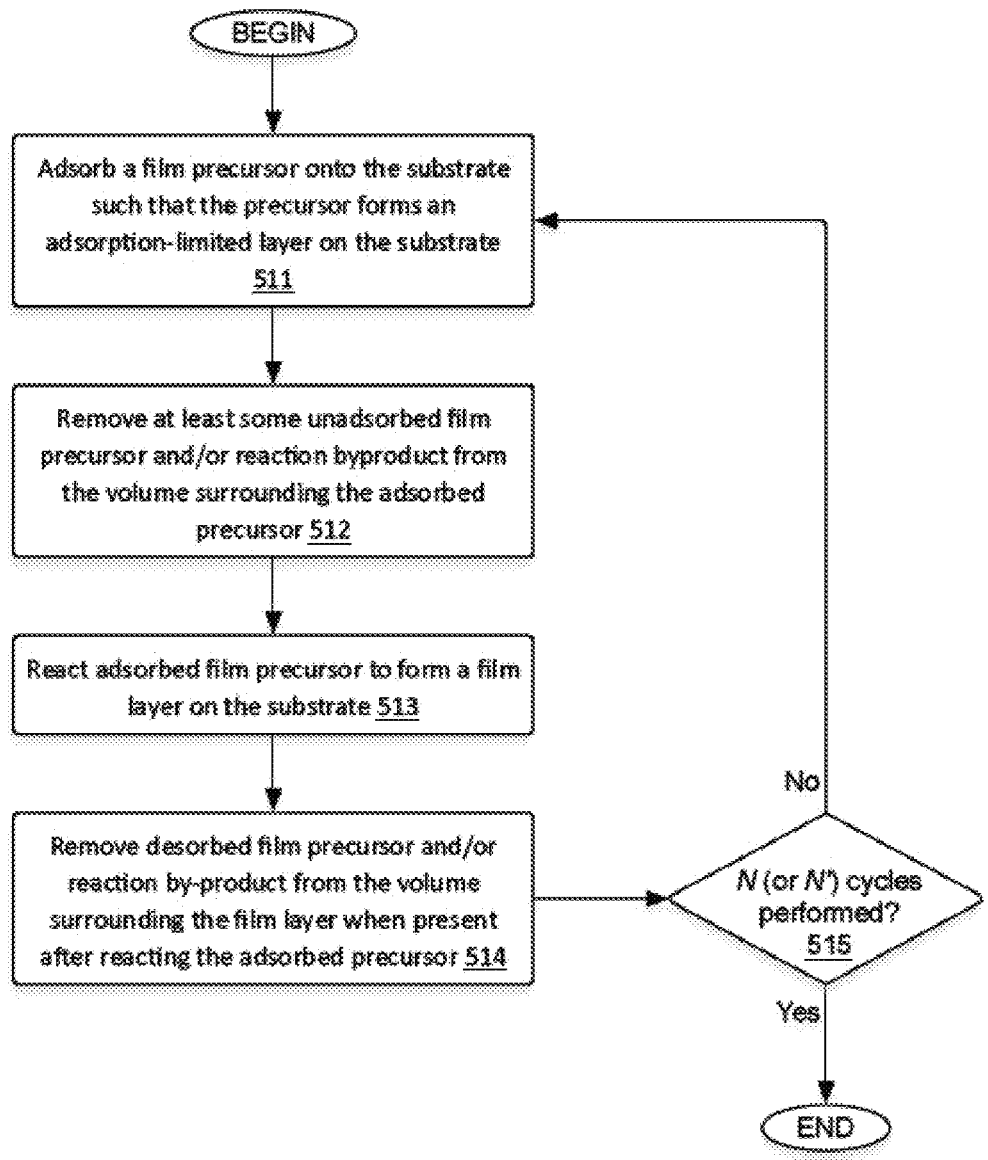
FIG. 5A is a flowchart of an example sequence of operations for forming a film of material on a substrate via an ALD process.

Accordingly, a basic sequence of operations for forming a film of material on a substrate via an ALD process is schematically illustrated by the flowchart in FIG. 5A. A shown in the figure, an ALD process for forming multiple film layers on a substrate may begin with an operation 511 of adsorbing a film precursor onto the substrate such that the precursor forms an adsorption-limited layer on the substrate, followed by an operation 512 of removing at least some unadsorbed film precursor and/or reactant byproduct from the volume surrounding the adsorbed precursor. Thereafter, in an operation 513, the adsorbed film precursor is reacted to form a film layer on the substrate, and following that, in operation 514, desorbed film precursor and/or reaction byproduct are removed from the volume surrounding the film layer when present after reacting the adsorbed precursor in operation 513.

The foregoing sequence of operations 511 through 514 represents one ALD cycle. However, since a single ALD cycle typically only deposits a thin layer of film, multiple ALD cycles may be repeated in sequence to form multiple layers of film (or, equivalently, a multi-layer film of the desired thickness). Thus, referring again to FIG. 5A, after an ALD cycle concludes with operation 514, in operation 515, it is determined whether a sufficient number of layers of film have been formed (or whether a film of a sufficient thickness has been deposited)—in this example, by determining whether N or N' cycles (as described above) have been performed—and if so, the film-forming operations conclude, whereas if not, the process sequence returns to operation 511 to begin another cycle of ALD. It is noted that the multi-substrate processing and film deposition operations described in the context of FIGS. 4A and 4B may employ these ALD film forming operations of FIG. 5A to simultaneously deposit film on multiple substrates.

Figure 5B:
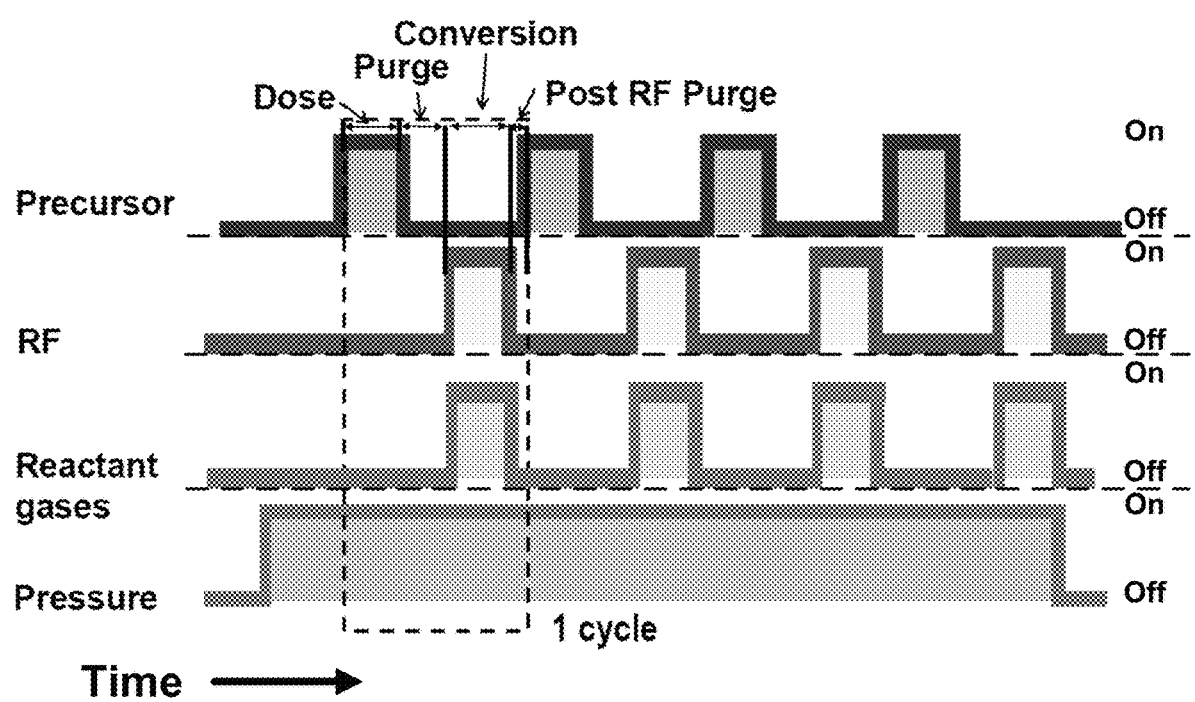
FIG. 5B is a timing diagram showing basic sequence of operations for forming films of material on a substrate via deposition processes.

One example of a sequence for forming films of material on a substrate via deposition processes, such as ALD processes, is further illustrated in the timing diagram of FIG. 5B. FIG. 5B illustrates the process steps for four deposition cycles, with each cycle including the process steps of precursor delivery, RF power delivery, reactant gas delivery, and pressurization of the processing chamber. The process steps in FIG. 5B are shown through their corresponding lines and are presented as Boolean values, either on or off. A process step is on if it's corresponding line is in the "on" position illustrated in FIG. 5B and a process step is off if it's corresponding line is in the "off" position illustrated in FIG. 5B.

During all four deposition cycles, the processing chamber may be pressurized. 1 cycle of deposition is highlighted in FIG. 5B. In that 1 cycle, the first phase of the deposition cycle may be a dose phase. During the dose phase, the precursor is delivered to the processing chamber, but the RF power is off and reactant gas or gases are not delivered. During the dose phase, the substrate may adsorb the precursor and form an adsorption layer on the substrate. The dose phase of FIG. 5B corresponds to operation 511 of FIG. 5A.

After the dose phase, there may then be a purge phase of the deposition cycle. During the purge phase, precursor delivery stops, but the RF power is still off and reactant gases are still not delivered. The purge phase may remove at least some unadsorbed film precursor and/or reactant byproduct from the volume surrounding the adsorbed precursor. The purge phase of FIG. 5B corresponds to operation 512 of FIG. 5A.

After the purge phase, the deposition cycle may then enter the conversion phase. During the conversion phase, RF power is turned on while the reactant gas or gases are also delivered. During the conversion phase, the adsorbed film precursor may be reacted to form a film layer on the substrate. The conversion phase of FIG. 5B corresponds to operation 513 of FIG. 5A.

Finally, after the conclusion of the conversion phase, the deposition cycle may enter the post RF purge phase. The post RF purge phase may remove desorbed film precursor and/or reaction byproduct from the volume surrounding the film layer when present after reacting the adsorbed precursor. The post RF purge phase of FIG. 5B corresponds to operation 514 of FIG. 5A.

In the 1 cycle highlighted in FIG. 5B, a thin layer of film, possibly of d thickness, may be deposited on the substrate. In certain embodiments, d may be a thickness of between 0.1 Å and 2.5 Å. Additionally cycles may also deposit layers of film, possibly of about d thickness, onto the substrate.

In some embodiments, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition—including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION" U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411 ; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes are oftentimes used to deposit conformal silicon oxide films (SiOx), however ALD processes may also be used to deposit conformal dielectric films of other chemistries as also disclosed in the foregoing incorporated specifications. ALD-formed dielectric films may, in some embodiments, contain a silicon carbide (SiC) material, a silicon nitride (SiN) material, a silicon carbonitride (SiCN) material, or a combination thereof. Silicon-carbon-oxides and silicon-carbon-oxynitrides, and silicon-carbon-nitrides may also be formed in some embodiment ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS," 003722; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Other examples of film deposition via ALD include chemistries for depositing dopant-containing films as described in the patent applications listed and incorporated by reference above (U.S. patent application Ser. Nos. 13/084,399, 13/242,084, 13/224,240, and 14/194,549). As described therein, various dopant-containing film precursors may be used for forming the dopant-containing films, such as films of boron-doped silicate glass (BSG), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like. Thus, dopant-containing films having dopants other than boron are feasible. Examples include gallium, phosphorous, or arsenic dopants, or other elements appropriate for doping a semiconductor substrate, such as other valence III and V elements.

As for ALD process conditions, ALD processes may be performed at various temperatures. In some embodiments, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes may be performed at various ALD reaction chamber pressures. In some embodiments, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some embodiments, suitable RF power may range from between about 100 W and 10 kW, or between about 200 W and 6 kW, or between about 500 W, and 3 kW, or between about 1 kW and 2 kW.

Various film precursor flow rates may be employed in operation (i). In some embodiments, suitable flow rates may range from between about 0.1 mL/min to about 10 mL/min, or between about 0.5 mL/min and about 5 mL/min, or between about 1 mL/min and about 3 mL/min.

Various gas flow rates may be used in the various operations. In some embodiments, general gas flow rates may range from between about 1 L/min and about 20 L/min, or between about 2 L/min and about 10 L/min. For the optional inert purge steps in operations (ii) and (iv), an employed burst flow rate may range from between about 20 L/min and about 100 L/min, or between about 40 L/min and about 60 L/min.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Also, once again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Detailed Description of Apparatuses

The methods described herein may be performed with any suitable semiconductor substrate processing apparatus. A suitable apparatus includes hardware for accomplishing the process operations and a system controller having instructions for controlling process operations in accordance with the various channel doping methodologies disclosed herein. In some embodiments, the hardware may include one or more process stations included in a multi-station substrate processing tool, and a controller having (or having access to) machine-readable instructions for controlling process operations in accordance with the processing techniques disclosed herein.

Thus, in some embodiments, an apparatus suitable for depositing films of material on multiple semiconductor substrates may include a first set of one or more process stations each having a substrate holder contained in a processing chamber, a second set of one or more process stations each having a substrate holder contained in the processing chamber, one or more valves for controlling flow of film precursor to the process stations, and one or more valve-operated vacuum sources for removing film precursor from the volumes surrounding the process stations contained in the one or more processing chambers. And, such an apparatus may also include a controller having (or having access to) machine-readable instructions for operating the substrate loading device, the substrate transferring device, the one or more valves, and the vacuum source to deposit films of material onto the substrates.

Thus, in some embodiments, said instructions executed by the controller may include instructions for forming films on multiple substrates at multiple process stations contained in a processing chamber, wherein multiple layers of the film are formed on each substrate by a sequence of ALD cycles. Thus, in certain such embodiments, said instructions executed by the controller may include instructions for performing ALD operations (i) though (iv) as described above, and instructions for repeating ALD operations (i) through (iv) multiple times to form multiple layers of film on the multiple substrates at the multiple process stations of the substrate processing apparatus.

Accordingly, FIG. 1 schematically shows an embodiment of a substrate processing apparatus 100. For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein. For example, FIG. 2A depicts an embodiment of a multi-station processing tool. Further, it will be appreciated that, in some embodiments, one or more hardware parameters of processing apparatus 100, including those discussed in detail above, may be adjusted programmatically by one or more system controllers.

Process station 100 fluidly communicates with reactant delivery system 101 for delivering process gases to a distribution showerhead 106. Reactant delivery system 101 includes a mixing vessel 804 for blending and/or conditioning process gases for delivery to showerhead 106. One or more mixing vessel inlet valves 120 may control introduction of process gases to mixing vessel 804.

Some reactants may be stored in liquid form prior to vaporization and subsequent delivery to the process chamber 102. The embodiment of FIG. 1 includes a vaporization point 103 for vaporizing liquid reactant to be supplied to mixing vessel 804. In some embodiments, vaporization point 103 may be a heated liquid injection module. In some embodiments, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 103 may be heat treated. In some examples, mixing vessel 804 may also be heat treated. In one non-limiting example, piping downstream of vaporization point 103 has an increasing temperature profile extending from approximately 100° C. to approximately 150° C. at mixing vessel 804.

As mentioned, in some embodiments the vaporization point 103 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 103. In one scenario, a liquid injector may be mounted directly to mixing vessel 804. In another scenario, a liquid injector may be mounted directly to showerhead 106.

In some embodiments, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 106 distributes process gases and/or reactants (e.g., film precursors) toward substrate 112 at the process station, the flow of which is controlled by one or more valves upstream from the showerhead (e.g., valves 120, 120A, 105). In the embodiment shown in FIG. 1, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some embodiments, a microvolume 107 is located beneath showerhead 106. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some embodiments, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 108 may allow a plasma density to be varied during plasma activation and/or treatment cycles included, for example, in an ALD or CVD process. At the conclusion of a deposition process phase, pedestal 108 may be lowered during another substrate transfer phase to allow removal of substrate 112 from pedestal 108.

While the example microvolume variations described herein refer to a height-adjustable pedestal, it will be appreciated that, in some embodiments, a position of showerhead 106 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some embodiments, pedestal 108 may include a rotational axis for rotating an orientation of substrate 112. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 1, showerhead 106 and pedestal 108 electrically communicate with RF power supply 114 and matching network 116 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Examples of suitable powers are included above. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 108 may be temperature controlled via heater 110. Further, in some embodiments, pressure control for processing apparatus 100 may be provided by one or more valve-operated vacuum sources such as butterfly valve 118. As shown in the embodiment of FIG. 1, butterfly valve 118 throttles a vacuum provided by a downstream vacuum pump (not shown). However, in some embodiments, pressure control of processing apparatus 100 may also be adjusted by varying a flow rate of one or more gases introduced to processing chamber 102. In some embodiments, the one or more valve-operated vacuum sources—such as butterfly valve 118—may be used for removing film precursor from the volumes surrounding the process stations during the appropriate ALD operational phases.

As described above, one or more process stations may be included in a multi-station substrate processing tool. FIG. 2A schematically illustrates an example of a multi-station processing tool 200 which includes a plurality of process stations 201, 202, 203, 204 in a common low-pressure processing chamber 214. By maintaining each station in a low-pressure environment, defects caused by vacuum breaks between film deposition processes may be avoided.

As shown in FIG. 2A, the multi-station processing tool 200 has a substrate loading port 220, and a robot 226 configured to move substrates from a cassette loaded through a pod 228 through atmospheric port 220, into the processing chamber 214, and onto one of the 4 stations 201, 202, 203, or 204.

The depicted processing chamber 214 shown in FIG. 2A provides four process stations, 201, 202, 203, and 204. Each station has a heated pedestal and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 214 may include one or more matched pairs of ALD/CVD process stations. While the depicted processing chamber 214 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

FIG. 2A also depicts an embodiment of a substrate transferring device 290 for transferring substrates between process stations 201, 202, 203, and 204 within processing chamber 214. It will be appreciated that any suitable substrate transferring device may be employed. Non-limiting examples include wafer carousels and substrate handler robots.

FIG. 2A also depicts an embodiment of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some embodiments, system controller 250 controls some or all of the operations of process tool 200 including the operations of its individual process stations. System controller 250 may execute machine-readable system control instructions 258 on processor 252—the system control instructions 258, in some embodiments, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components necessary to carry out various process tool processes. System control instructions 258 may be coded in any suitable computer readable programming language. In some embodiments, system control instructions 258 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 258 may include input/output control (IOC) sequencing instructions for controlling the various parameters described above. For example, each phase of a deposition process or processes may include one or more instructions for execution by system controller 250. The instructions for setting process conditions for a film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 254 and/or memory device 256 associated with system controller 250 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 218 and to control the spacing between the substrate and other parts of process tool 200. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

System controller 250 may provide machine-readable instructions for implementing the above-described deposition processes. The instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Other Embodiments

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

We claim:

1. A multi-station substrate processing apparatus for performing multi-step atomic layer deposition to deposit films of material on a batch of semiconductor substrates, each batch having a plurality of pairs of substrates, the apparatus comprising:
   a processing chamber;
   a first set of process stations contained in the processing chamber, each having a substrate holder;
   a second set of process stations contained in the processing chamber, each having a substrate holder;
   one or more valves for controlling flow of film precursor to the process stations;
   a valve-operated vacuum source for removing film precursor from the volumes surrounding the process stations contained in the processing chamber;
   a substrate loading device for loading substrates into the processing chamber at one or more of the process stations;
   a substrate transferring device for transferring one or more substrates from the first set of process stations to the second set of process stations;
   one or more controllers comprising machine-readable instructions for operating the substrate loading device, the substrate transferring device, the one or more valves, and the vacuum source to deposit films of material onto the substrates, including instructions for:
   (a) loading a first pair of substrates into the processing chamber at the first set of process stations;
   (b) depositing film material onto the first pair of substrates at the first set of process stations by performing exactly N cycles of film deposition, wherein each cycle of film deposition at the first set of process stations results in a film of material having a thickness of between about 0.1 Angstrom and about 2.5 Angstroms;
   (c) after the depositing in (b), transferring the first pair of substrates from the first set of process stations to the second set of process stations;
   (d) loading a second pair of substrates into the processing chamber at the first set of process stations;
   (e) depositing film material onto the second pair of substrates at the first set of process stations and onto the first pair of substrates at the second set of process stations by performing exactly N' cycles of film deposition, wherein N' is not equal to N, wherein N' is equal to N+1 or N−1 such that the total combined thickness from two depositions is 2N+1 or 2N−1, wherein N and N' are each greater than or equal to about 50, and wherein each cycle of film deposition at the first and second sets of process stations results in a film of material having a thickness of between about 0.1 Angstrom and about 2.5 Angstroms;
   (f) after the depositing in (e), unloading the first pair of substrates from the processing chamber, transferring the second pair of substrates from the first to the second set of process stations, and loading a third pair of substrates into the processing chamber at the first set of process stations,
   (g) after (f), depositing film material onto the second pair of substrates at the second set of process stations and onto the third pair of substrates at the first set of process stations by performing exactly N cycles of film deposition, wherein each cycle of film deposition at the first and second sets of process stations results in a film of material having a thickness of between about 0.1 Angstrom and about 2.5 Angstroms,
(h) after the depositing in (g), unloading the second pair of substrates from the processing chamber; transferring the third pair of substrates to the second set of process stations, and loading a fourth pair of substrates into the processing chamber at the first set of process stations, and
(i) repeating (e) though (h) for the third pair of substrates, the fourth pair of substrates, and each of the other pairs of substrates in the batch such that the third pair of substrates, the fifth pair of substrates, and each of the other odd-numbered pairs of substrates in the batch receives exactly N cycles of film deposition at the first set of process stations and exactly N' cycles of film deposition at the second set of process stations, and such that the fourth pair of substrates, the sixth pair of substrates, and each of the other even-numbered pairs of substrates in the batch receives exactly N' cycles of film deposition at the first set of process stations and exactly N cycles of film deposition at the second set of process stations.

2. The apparatus of claim 1, further comprising a carousel, wherein
loading in each of (a), (d), (f), and (h) further comprises loading the substrates onto the carousel, and unloading in each of (a), (d), (f), and (h) further comprises unloading the substrates from the carousel, and
transferring in each of (c), (f), and (h) further comprises rotating the carousel by 180 degrees.

3. The apparatus of claim 2, wherein the carousel which operates by rotating the substrates with respect to a central axis substantially perpendicular to the plane of the substrates and substantially equidistant between the substrates.

4. The apparatus of claim 1, wherein a single cycle of film deposition comprises:
(i) adsorbing a film precursor onto the substrate such that the precursor forms an adsorption-limited layer on the substrate;
(ii) removing at least some unadsorbed film precursor from the volume surrounding the adsorbed precursor;
(iii) reacting adsorbed film precursor, after removing unadsorbed precursor in (ii), to form a film layer on the substrate; and
(iv) removing desorbed film precursor and/or reaction by-product from the volume surrounding the film layer when present after reacting the adsorbed precursor.

5. The apparatus of claim 1, wherein the substrate loading device comprises a substrate handler robot for placing substrates onto the substrate holder(s) of one or more process stations.

6. The apparatus of claim 1, wherein the processing chamber contains 4 process stations, and wherein each of the first and second sets of process stations consist of 2 process stations.

7. The apparatus of claim 1, wherein the one or more controllers further comprise machine-readable instructions for:
choosing a target thickness D of the deposited film;
choosing N to be the closest positive integer to $\frac{1}{2}*D/d$, where d is the anticipated mean thickness of a layer of film deposited by a single cycle of film deposition.

8. The apparatus of claim 7, wherein the one or more controllers further comprise machine-readable instructions for:
choosing N' to be N when $|\Delta|<d/2$, where $\Delta=2*/d*N-D$;
choosing N' to be N−1 when $|\Delta|>d/2$ and $\Delta>0$, where $\Delta=2*d*N-D$; and
choosing N' to be N+1 when $|\Delta|>d/2$ and $\Delta<0$, where $\Delta=2*d*N-D$.

9. A multi-station substrate processing apparatus for performing multi-step atomic layer deposition to deposit films of material on a batch of semiconductor substrates, each batch having a plurality of pairs of substrates the apparatus comprising:
a processing chamber having four process stations;
one or more valves for controlling flow of film precursor to the process stations;
a valve-operated vacuum source for removing film precursor from the volumes surrounding the process stations contained in the processing chamber;
a substrate loading device for loading substrates into the processing chamber at one or more of the process stations;
a substrate transferring device for transferring one or more substrates from the first process station to the second process station;
one or more controllers comprising machine-readable instructions for operating the substrate loading device, the substrate transferring device, the one or more valves, and the vacuum source to deposit films of material onto the substrates, including instructions for:
(a) loading four substrates into the processing chamber, with the first substrate at the first process station, the second substrate at the second process station, the third substrate at the third process station, and the fourth substrate at the fourth process station;
(b) depositing, after (a), a portion of a defined film thickness on the four substrates by performing exactly N cycles of film deposition at the four process stations, wherein each cycle of film deposition results in a film of material having a thickness of between about 0.1 Angstrom and about 2.5 Angstroms;
(c) transferring the first substrate from the first process station to the second process station, transferring the second substrate from the second process station to the third process station, transferring the third substrate from the third process station to the fourth process station, and transferring the fourth substrate from the fourth process station to the first process station;
(d) depositing, after (c), another portion of the defined film thickness on the four substrates by performing exactly N' cycles of the cyclic deposition process at the four process stations, wherein N does not equal N', wherein N' is equal to N+1 or N−1 such that the total combined thickness from two the depositions in (b) and (d) is 2N+1 or 2N−1, wherein N and N' are chosen to achieve the defined film thickness, wherein N and N' are each greater than or equal to about 50, and wherein each cycle of film deposition at the first and second sets of process stations results in a film of material having a thickness of between about 0.1 Angstrom and about 2.5 Angstroms;
(e) after (d), transferring the first substrate from the second process station to the third process station, transferring the second substrate from the third process station to the fourth process station, transferring the third substrate from the fourth process station to the first process station, and transferring the fourth substrate from the first process station to the second process station;

(f) depositing, after (e), yet another portion of the film thickness on the four substrates by performing exactly N" cycles of the cyclic deposition process at the four process stations, wherein N" is equal to N, N+1, or N−1, wherein N, N', and N" are chosen to achieve the defined thickness, wherein N" is greater than or equal to about 50, and wherein each cycle of film deposition results in a film of material having a thickness of between about 0.1 Angstrom and about 2.5 Angstroms;

(g) after (f), transferring the first substrate from the third process station to the fourth process station, transferring the second substrate from the fourth process station to the first process station, transferring the third substrate from the first process station to the second process station, and transferring the fourth substrate from the second process station to the third process station;

(i) after (g), depositing an additional portion of the film thickness on the four substrates by performing exactly N''' cycles of the cyclic deposition process at the four process stations, wherein N''' is equal to N, N+1 or N−1, wherein N, N', N", and N''' are chosen to achieve the defined thickness, wherein N''' is greater than or equal to about 50, and wherein each cycle of film deposition results in a film of material having a thickness of between about 0.1 Angstrom and about 2.5 Angstroms; and (j) removing at least the first substrate from the reaction chamber.

10. The apparatus of claim 9, wherein the one or more controllers further comprise machine-readable instructions for:

(k) after (j), receiving four other substrates from the batch of substrates into the processing chamber, with one substrate in each of the four process stations; and (l) repeating (b) through (j) for the four other substrates.

11. The apparatus of claim 9, wherein a single cycle of film deposition comprises:

(i) adsorbing a film precursor onto the substrate such that the precursor forms an adsorption-limited layer on the substrate;

(ii) removing at least some unadsorbed film precursor from the volume surrounding the adsorbed precursor;

(iii) reacting adsorbed film precursor, after removing unadsorbed precursor in (ii), to form a film layer on the substrate; and (iv) removing desorbed film precursor and/or reaction by-product from the volume surrounding the film layer when present after reacting the adsorbed precursor.

12. The apparatus of claim 9, wherein the substrate loading device comprises a substrate handler robot for placing substrates onto at least one of the process stations.

13. The apparatus of claim 9, wherein the substrate transferring device comprises a carousel which operates by rotating the substrates with respect to a central axis substantially perpendicular to the plane of the substrates and substantially equidistant between the substrates.

14. The apparatus of claim 9, wherein:

receiving the four substrates in (a) further comprises receiving all four substrates onto the carousel, and transferring the four substrates in each of (c), (e), and (g) further comprises rotating the carousel by 90 degrees.

15. The apparatus of claim 14, wherein the one or more controllers further comprise machine-readable instructions for:

choosing a target thickness D of the deposited film;

choosing N to be the closest positive integer to $\frac{1}{4}*D/d$, where d is the anticipated mean thickness of a layer of film deposited by a single cycle of film deposition.

16. The apparatus of claim 15, wherein the one or more controllers further comprise machine-readable instructions for:

choosing N' to be N when $|\Delta|<d/2$, where $\Delta=4*d*N-D$;

choosing N' to be N−1 when $|\Delta|>d/2$ and $\Delta>0$, where $\Delta=4*d*N-D$; and choosing N' to be N+1 when $|\Delta|>d/2$ and $\Delta<0$, where $\Delta=4*d*N-D$.

17. A machine-readable medium having machine-readable instructions for:

(a) loading a first pair of substrates into a processing chamber at a first set of one or more process stations;

(b) depositing a film material onto the first pair of substrates at the first set of process stations by performing N cycles of film deposition, wherein each cycle of film deposition at the first set of process stations results in a film of material having a thickness of between about 0.1 Angstrom and about 2.5 Angstroms;

(c) after the depositing in (b), transferring the first pair of substrates from the first set of process stations to a second set of one or more process stations in the processing chamber;

(d) loading a second pair of substrates into the processing chamber at the first set of process stations;

(e) depositing film material onto the second pair of substrates at the first set of process stations and onto the first pair of substrates at the second set of process stations by performing exactly N' cycles of film deposition, wherein N' is not equal to N, wherein N' is equal to N+1 or N−1 such that the total combined thickness from two depositions is 2N+1 or 2N−1, wherein N and N' are each greater than or equal to about 50, and wherein each cycle of film deposition at the first and second sets of process stations results in a film of material having a thickness of between about 0.1 Angstrom and about 2.5 Angstroms;

(f) after the depositing in (e), unloading the first pair of substrates from the processing chamber, transferring the second pair of substrates from the first to the second set of process stations, and loading a third pair of substrates into the processing chamber at the first set of process stations, (g) after (f), depositing film material onto the second pair of substrates at the second set of process stations and onto the third pair of substrates at the first set of process stations by performing exactly N cycles of film deposition, wherein each cycle of film deposition at the first and second sets of process stations results in a film of material having a thickness of between about 0.1 Angstrom and about 2.5 Angstroms, (h) after the depositing in (g), unloading the second pair of substrates from the processing chamber; transferring the third pair of substrates to the second set of process stations, and loading a fourth pair of substrates into the processing chamber at the first set of process stations, and (i) repeating (e) though (h) for the third pair of substrates, the fourth pair of substrates, and each of the other pairs of substrates in the batch such that the third pair of substrates, the fifth pair of substrates, and each of the other odd-numbered pairs of substrates in the batch receives exactly N cycles of film deposition at the first set of process stations and exactly N' cycles of film deposition at the second set of process stations, and such that the fourth pair of substrates, the sixth pair of substrates, and each of the other even-numbered pairs of substrates in the batch receives exactly N' cycles of film deposition at the first set of process stations and exactly N cycles of film deposition at the second set of process stations.

* * * * *